US012701668B2

(12) United States Patent
Shin et al.

(10) Patent No.: US 12,701,668 B2
(45) Date of Patent: Aug. 4, 2026

(54) HINGE ASSEMBLY AND FOLDABLE ELECTRONIC DEVICE INCLUDING THE SAME

(71) Applicant: Samsung Electronics Co., Ltd., Suwon-si (KR)

(72) Inventors: Wonho Shin, Suwon-si (KR); Junghoon Park, Suwon-si (KR); Joongkyung Park, Suwon-si (KR); Hyounggil Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 105 days.

(21) Appl. No.: 17/813,867

(22) Filed: Jul. 20, 2022

(65) Prior Publication Data

US 2022/0408580 A1 Dec. 22, 2022

Related U.S. Application Data

(63) Continuation of application No. PCT/KR2022/006306, filed on May 3, 2022.

(30) Foreign Application Priority Data

Jun. 16, 2021 (KR) ........................ 10-2021-0077845

(51) Int. Cl.
*H05K 5/00* (2025.01)
*F16C 11/04* (2006.01)
*H05K 5/02* (2006.01)

(52) U.S. Cl.
CPC ............ *H05K 5/0226* (2013.01); *F16C 11/04* (2013.01); *H05K 5/0018* (2022.08)

(58) Field of Classification Search
None
See application file for complete search history.

(56) References Cited

U.S. PATENT DOCUMENTS 7,509,709 B2 * 3/2009 Chung .................. G06F 1/1681
16/319
7,533,446 B1 * 5/2009 Lin ........................ G06F 1/1681
16/303
(Continued)

FOREIGN PATENT DOCUMENTS

EP 4266653 B1 7/2025
JP 2001-251397 A 9/2001
(Continued)

OTHER PUBLICATIONS

International Search Report dated Aug. 12, 2022 in connection with International Patent Application No. PCT/KR2022/006306, 3 pages.
(Continued)

*Primary Examiner* — Imani N Hayman
*Assistant Examiner* — Rashen E Morrison

(57) ABSTRACT

A foldable electronic device includes: a display, a first housing, a second housing, and a hinge assembly, wherein the hinge assembly includes: a hinge cover connected to the first housing and the second housing, a first hinge connected to the hinge cover to support the first area, and a second hinge connected to the hinge cover to support the second area, wherein each of the first hinge and the second hinge includes: a shaft with a folding axis, a first cam configured to perform a linear motion along the folding axis, a second cam configured to contact the first cam, and a third cam configured to contact the first cam, wherein the first cam is configured to contact only one of the second cam and the third cam.

20 Claims, 23 Drawing Sheets

(56)  References Cited

U.S. PATENT DOCUMENTS

| | | | | |
|---|---|---|---|---|
| 8,776,319 | B1 * | 7/2014 | Chang | G06F 1/1681 |
| | | | | 16/303 |
| 10,845,850 | B1 | 11/2020 | Kang et al. | |
| 11,079,809 | B2 * | 8/2021 | Morino | G06F 1/1616 |
| 11,359,425 | B2 * | 6/2022 | Chang | G06F 1/1681 |
| 11,379,013 | B2 * | 7/2022 | Cha | G06F 1/1652 |
| 11,573,611 | B2 * | 2/2023 | Channaiah | E05D 11/105 |
| 11,720,152 | B2 * | 8/2023 | Hsu | G06F 1/1681 |
| | | | | 16/354 |
| 11,853,130 | B2 * | 12/2023 | Yu | F16C 11/04 |
| 2008/0101003 | A1 * | 5/2008 | Lin | G06F 1/203 |
| | | | | 361/679.55 |
| 2013/0111704 | A1 * | 5/2013 | Mitsui | G06F 1/1681 |
| | | | | 16/250 |
| 2015/0020351 | A1 * | 1/2015 | Lin | E05D 3/12 |
| | | | | 16/366 |
| 2018/0066465 | A1 * | 3/2018 | Tazbaz | E05D 11/1007 |
| 2018/0363341 | A1 * | 12/2018 | Siddiqui | E05D 3/122 |
| 2019/0132975 | A1 | 5/2019 | Kim et al. | |
| 2020/0348732 | A1 | 11/2020 | Kang et al. | |
| 2021/0055763 | A1 | 2/2021 | Park | |

FOREIGN PATENT DOCUMENTS

| | | |
|---|---|---|
| JP | 2005-130073 A | 5/2005 |
| JP | 2006-132658 A | 5/2006 |
| JP | 2009-138790 A | 6/2009 |
| JP | 2010-164076 A | 7/2010 |
| JP | 2020-125841 A | 8/2020 |
| KR | 10-2004-0050783 A | 6/2004 |
| KR | 10-2005-0005204 A | 1/2005 |
| KR | 10-0496592 B1 | 6/2005 |
| KR | 10-0544767 B1 | 1/2006 |
| KR | 10-2006-0101637 A | 9/2006 |
| KR | 10-0777226 B1 | 11/2007 |
| KR | 10-2009-0058623 A | 6/2009 |
| KR | 10-0941953 B1 | 2/2010 |
| KR | 10-2010-0095857 A | 9/2010 |
| KR | 10-2010-0131568 A | 12/2010 |
| KR | 10-1066046 B1 | 9/2011 |
| KR | 10-1847047 B1 | 4/2018 |
| KR | 10-2020-0126524 A | 11/2020 |
| KR | 10-2020-0138948 A | 12/2020 |
| RU | 2683290 C2 | 3/2019 |
| RU | 198443 U1 | 7/2020 |
| WO | 2013179611 A1 | 12/2013 |

OTHER PUBLICATIONS

Supplementary European Search Report dated Jun. 14, 2024, in connection with European Patent Application No. 22825152.6, 8 pages.

Decision to Grant a Patent for Invention and Search Report issued Apr. 4, 2024, in connection with Russian Application No. 2023126954, 21 pages.

Notice of Preliminary Rejection dated Nov. 12, 2024, in connection with Japanese Application No. 2023-267152, 3 pages.

Notice of Preliminary Rejection dated Jun. 6, 2025, in connection with Korean Application No. 10-2021-0077845, 5 pages.

Office Action dated Oct. 23, 2023, in connection with Vietnamese Application No. 1-2023-08800, 3 pages.

* cited by examiner 8852    8832

8852b

901

920

910

10832

10852c

10852a

10842

10852

1086

A

HINGE ASSEMBLY AND FOLDABLE ELECTRONIC DEVICE INCLUDING THE SAME

CROSS-REFERENCE TO RELATED APPLICATIONS

This application is a continuation of International Application No. PCT/KR2022/006306 designating the United States, filed on May 3, 2022, in the Korean Intellectual Property Receiving Office and claims priority to Korean Patent Application No. 10-2021-0077845, filed on Jun. 16, 2021, in the Korean Intellectual Property Office, the disclosures of which are incorporated by reference herein in their entireties.

BACKGROUND

1. Field

The following various example embodiments relate to a hinge assembly and a foldable electronic device including the same.

2. Description of Related Art

Foldable electronic devices with flexible displays folded and unfolded using hinge assemblies are being developed. A user may use an electronic device from a closed state to an open state more frequently than using the electronic device from the closed state through a stop section to the open state. Some hinge assemblies may stay in the stop section where folding/unfolding of electronic devices is stopped by friction between a fully closed state and a fully open state and may require an additional motion of a user to enter the fully closed state or the fully open state from the stop section.

SUMMARY

Various example embodiments provide a foldable electronic device including a hinge assembly that operates from a fully closed state to a fully open state at once rather than staying in a stop section during the opening of the electronic device and that enters the stop section during the closing of the electronic device.

According to an example embodiment, a foldable electronic device includes: a display including a first area, a second area, and a flexible area between the first area and the second area, a first housing located around the first area of the display, a second housing located around the second area of the display, and a hinge assembly connected between the first housing and the second housing adjacent to at least a portion of the flexible area of the display and configured to operate between a folded position at which the first area and the second area face each other and an unfolded position at which the first area and the second area do not face each other, wherein the hinge assembly includes: a hinge cover connected to the first housing and the second housing, a first hinge connected to the hinge cover to support the first area of the display, and a second hinge connected to the hinge cover to support the second area of the display, wherein each of the first hinge and the second hinge includes: a shaft with a folding axis, a first cam configured to perform a linear motion along the folding axis, a second cam configured to contact the first cam, and a third cam configured to contact the first cam, wherein the first cam is configured to contact only one of the second cam and the third cam.

According to an example embodiment, a hinge assembly includes: a hinge cover and a hinge connected to the hinge cover, wherein the hinge includes: a shaft with a folding axis, a first cam configured to perform a linear motion along the folding axis, a second cam configured to contact the first cam, and a third cam configured to contact the first cam, wherein the first cam is configured to contact only one of the second cam and the third cam.

According to various example embodiments, it is possible to improve user convenience through a hinge assembly that operates from a fully closed state to a fully open state at once rather than staying in a stop section during the opening of the electronic device and that enters the stop section during the closing of the electronic device.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

FIGS. 1 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
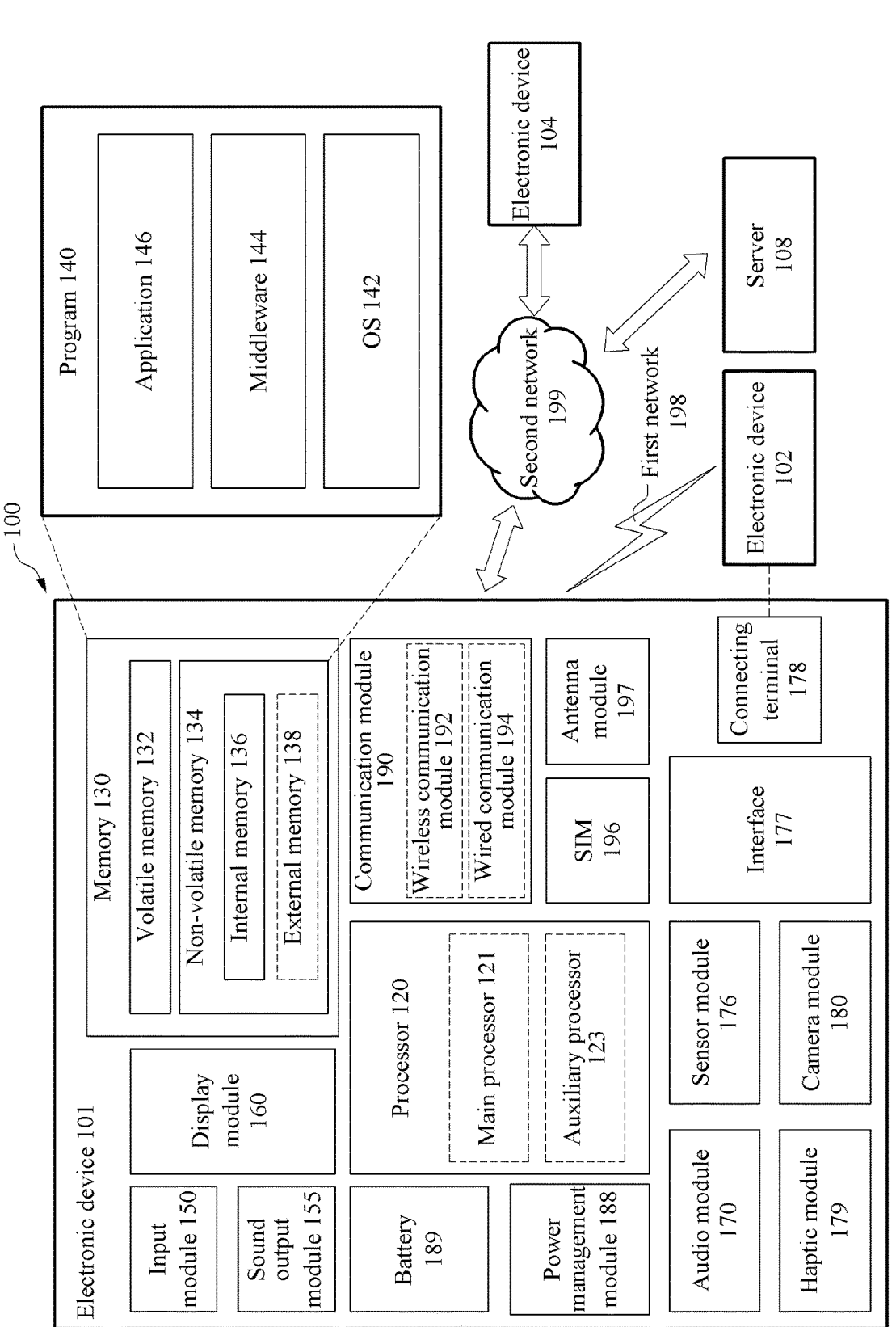
FIG. 1 is a block diagram of an electronic device in a network environment according to various example embodiments.

Referring to FIG. 1, an electronic device 101 in a network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In certain example embodiments, at least one (e.g., the connecting terminal 178) of the above components may be omitted from the electronic device 101, or one or more other components may be added in the electronic device 101. In certain example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120 and may perform various data processing or computation. According to an example embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a portion of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may additionally or alternatively include a software structure other than the hardware structure.

The memory 130 may store various data used by at least one component (e.g., the processor 120 or the sensor module

176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a portion of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electrical signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101 and generate an electrical signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a portion of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., a LAN or a wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a portion of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated a high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least portion of the function or the service. The one or more external electronic devices receiving the request may perform the at least portion of the function or the service requested, or an additional function or an additional service related to the request and may transfer an outcome of the performing to the electronic device 101. The electronic device 101 may provide the outcome, with or without further processing of the outcome, as at least portion of a reply to the request. To that end, a cloud computing, distributed computing, mobile edge computing (MEC), or client-server computing technology may be used, for example. The electronic device 101 may provide ultra-low-latency services using, e.g., distributed computing or mobile edge computing. In certain embodiments, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smartphone), a computer device, a portable multimedia device, a portable medical device, a camera, a wearable device, or a home appliance device. According to an example embodiment of the disclosure, the electronic device is not limited to those described above.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various example embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least portion of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components. According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
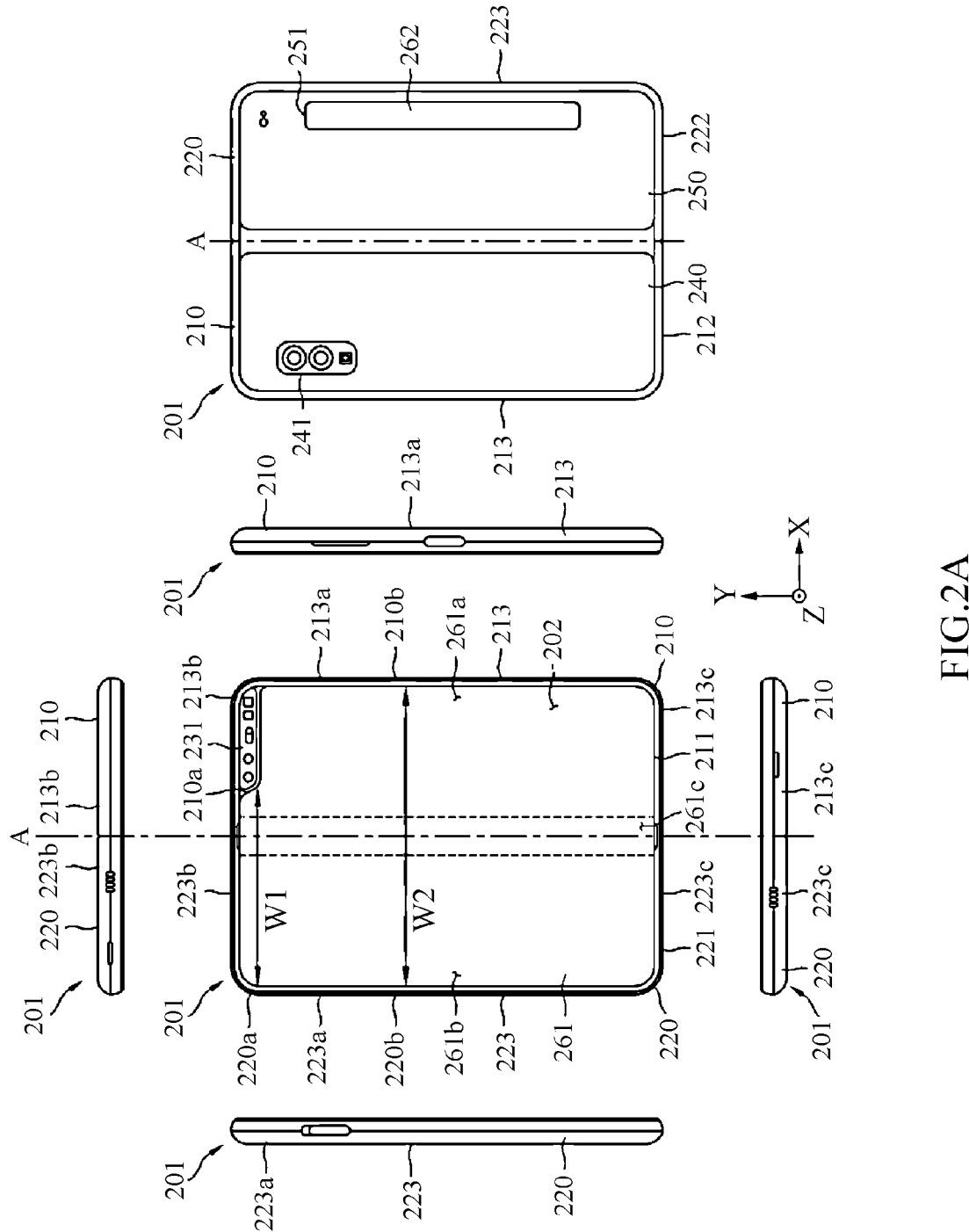
FIG. 2A is a view of an unfolded state of an electronic device according to various example embodiments.
Figure 2B:
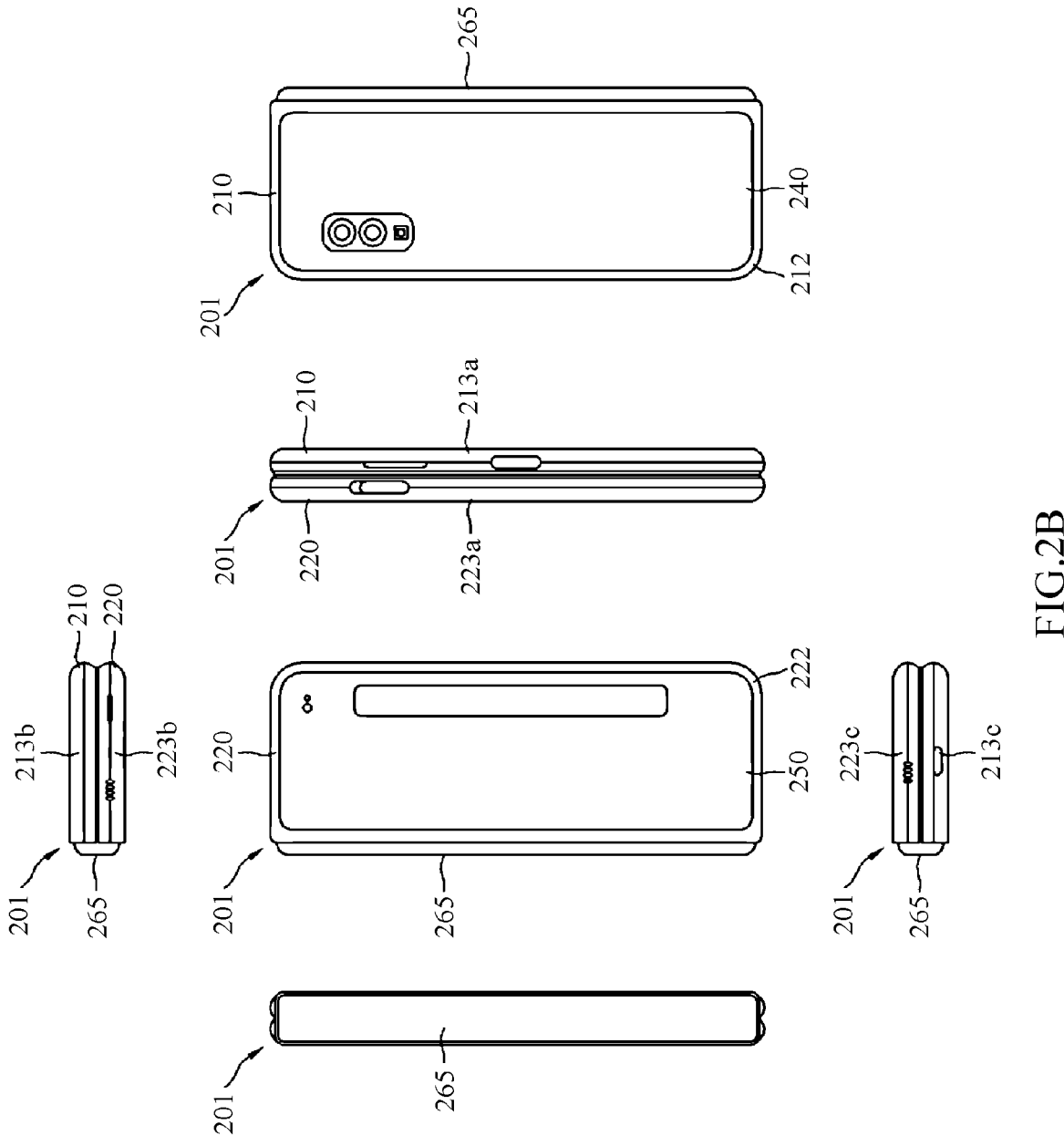
FIG. 2B is a view of a folded state of an electronic device according to various example embodiments.

Referring to FIGS. 2A and 2B, a foldable electronic device 201 may include a pair of housings 210 and 220 rotatably coupled to each other through a hinge to be folded with respect to each other, a hinge cover 265 for covering foldable portions of the pair of housings 210 and 220, and a display 261 (e.g., a flexible display or a foldable display) disposed in a space formed by the pair of housings 210 and 220. In the present disclosure, a surface on which the display 261 is disposed may be defined as a front surface of the foldable electronic device 201, and a surface opposite to the front surface may be defined as a rear surface of the foldable electronic device 201. In addition, a surface surrounding a space between the front surface and the rear surface may be defined as a side surface of the foldable electronic device 201.

In certain example embodiments, the pair of housings 210 and 220 may include a first housing 210 including a sensor area 231, a second housing 220, a first rear cover 240, and a second rear cover 250. The pair of housings 210 and 220 of the electronic device 201 are not limited to the shapes or the combination and/or coupling of components shown in FIGS. 2A and 2B and may be implemented in other shapes or by another combination and/or coupling of components.

In certain example embodiments, the first housing 210 and the second housing 220 may be disposed on both sides with respect to a folding axis A, and may be disposed substantially symmetrical with respect to the folding axis A. In certain example embodiments, an angle or distance between the first housing 210 and the second housing 220 may vary depending on whether the electronic device 201 is in an unfolded state, a folded state, or an intermediate state. In certain example embodiments, unlike the second housing 220, the first housing 210 may include the sensor area 231 in which various sensor modules (e.g., the sensor modules 176 of FIG. 1) are arranged. However, the first housing 210 and the second housing 220 may be mutually symmetrical in areas other than the sensor area 231. In certain example embodiments, the sensor area 231 may be disposed in at least a partial area of the second housing 220. In certain example embodiments, the sensor area 231 may be replaced with at least a partial area of the second housing 220. The sensor area 231 may include, for example, a camera hole area, a sensor hole area, an under-display camera (UDC) area, and/or an under-display sensor (UDS) area.

In certain example embodiments, the first housing 210 may be connected to a hinge in the unfolded state of the electronic device 201. The first housing 210 may include a first surface 211 facing the front surface of the electronic device 201, a second surface 212 facing a direction opposite to the first surface 211, and a first side portion 213 enclosing at least a portion of a space between the first surface 211 and the second surface 212. The first side portion 213 may include a first side surface 213a disposed substantially in parallel with the folding axis A, a second side surface 213b extending in a direction substantially perpendicular to the folding axis A from one end of the first side surface 213a, and a third side surface 213c extending in a direction substantially perpendicular to the folding axis A from another end of the first side surface 213a and substantially parallel to the second side surface 213b. The second housing 220 may be connected to the hinge in the unfolded state of the electronic device 201. The second housing 220 may include a third surface 221 facing the front surface of the electronic device 201, a fourth surface 222 facing a direction opposite to the third surface 221, and a second side portion 223 enclosing at least a portion of a space between the third surface 221 and the fourth surface 222. The second side portion 223 may include a fourth side surface 223a disposed substantially in parallel with the folding axis A, a fifth side surface 223b extending in a direction substantially perpendicular to the folding axis A from one end of the fourth side surface 223a, and a sixth side surface 223c extending in a direction substantially perpendicular to the folding axis A from another end of the fourth side surface 223a and substantially parallel to the fifth side surface 223b. The first surface 211 and the third surface 221 may face each other when the electronic device 201 is in the folded state.

In certain example embodiments, the electronic device 201 may include a recessed accommodating portion 202 for accommodating the display 261 through the structural coupling of the first housing 210 and the second housing 220. The accommodating portion 202 may have substantially the same size as the display 261. In certain example embodiments, due to the sensor area 231, the accommodating portion 202 may have at least two different widths in a direction perpendicular to the folding axis A. For example, the accommodating portion 202 may have a first width W1 between a first portion 210a of the first housing 210 formed on a periphery of the sensor area 231 and a second portion 220a of the second housing 220 parallel to the folding axis A, and a second width W2 between a third portion 210b of the first housing 210 parallel to the folding axis A and not overlapping the sensor area 231 and a fourth portion 220b of the second housing 220. Here, the second width W2 may be greater than the first width W1. In other words, the accommodating portion 202 may be formed to have the first width W1 from the first portion 210a of the first housing 210 to the second portion 220a of the second housing 220 that are mutually asymmetrical, and the second width W2 from the third portion 210b of the first housing 210 to the fourth portion 220b of the second housing 220. The first portion 210a and the third portion 210b of the first housing 210 may be formed at different distances from the folding axis A. Meanwhile, the widths of the accommodating portion 202 may not be limited to the shown example. For example, the accommodating portion 202 may have three or more different widths due to the shape of the sensor area 231 or the asymmetric shapes of the first housing 210 and the second housing 220.

In certain example embodiments, at least a portion of the first housing 210 and the second housing 220 may be formed of a metal material or a non-metal material having a predetermined magnitude of rigidity appropriate to support the display 261.

In certain example embodiments, the sensor area 231 may be formed adjacent to one corner of the first housing 210. However, the arrangement, shape, or size of the sensor area 231 are not limited to the shown example. In certain example embodiments, the sensor area 231 may be formed at another corner of the first housing 210 or in a predetermined area of an upper corner and a lower corner. In certain example embodiments, the sensor area 231 may be disposed in at least a partial area of the second housing 220. In certain example embodiments, the sensor area 231 may be formed to extend between the first housing 210 and the second housing 220.

In certain example embodiments, the electronic device 201 may include at least one component arranged on the front surface of the electronic device 201 to be exposed through the sensor area 231 or through at least one opening formed in the sensor area 231 to perform various functions. For example, the component may include at least one of a front camera module, a receiver, a proximity sensor, an illuminance sensor, an iris recognition sensor, an ultrasonic sensor, or an indicator.

In certain example embodiments, the first rear cover 240 may be disposed on the second surface 212 of the first housing 210 and may have a substantially rectangular periphery. At least a portion of the periphery of the first rear cover 240 may be surrounded by the first housing 210. The second rear cover 250 may be disposed on the fourth surface 222 of the second housing 220 and may have a substantially rectangular periphery. At least a portion of the periphery of the second rear cover 250 may be surrounded by the second housing 220.

In certain example embodiments, the first rear cover 240 and the second rear cover 250 may have substantially symmetrical shapes with respect to the folding axis A. In certain embodiments, the first rear cover 240 and the second rear cover 250 may have different shapes. In still another example embodiment, the first housing 210 and the first rear cover 240 may be integrally formed, and the second housing 220 and the second rear cover 250 may be integrally formed.

In certain example embodiments, the first housing 210, the second housing 220, the first rear cover 240, and the second rear cover 250 may provide a space in which various components (e.g., a PCB, the antenna module 197 of FIG. 1, the sensor module 176 of FIG. 1, or the battery 189 of FIG. 1) of the electronic device 201 may be arranged through a structure in which the first housing 210, the second housing 220, the first rear cover 240, and the second rear cover 250 are coupled to one another. In certain example embodiments, at least one component may be visually exposed on the rear surface of the electronic device 201. For example, at least one component may be visually exposed through a first rear area 241 of the first rear cover 240. Here, the component may include a proximity sensor, a rear camera module, and/or a flash. In certain example embodiments, at least a portion of a sub-display 262 may be visually exposed through a second rear area 251 of the second rear cover 250. In certain example embodiments, the electronic device 201 may include a sound output module (e.g., the sound output module 155 of FIG. 1) disposed through at least a partial area of the second rear cover 250.

In certain example embodiments, the display 261 may be disposed in the accommodating portion 202 formed by the pair of housings 210 and 220. For example, the display 261 may be arranged to occupy substantially most of the front surface of the electronic device 201. The front surface of the electronic device 201 may include an area in which the display 261 is disposed, and a partial area (e.g., a periphery area) of the first housing 210 and a partial area (e.g., a periphery area) of the second housing 220, which are adjacent to the display 261. The rear surface of the electronic device 201 may include the first rear cover 240, a partial area (e.g., a periphery area) of the first housing 210 adjacent to the first rear cover 240, the second rear cover 250, and a partial area (e.g., a periphery area) of the second housing 220 adjacent to the second rear cover 250. In certain example embodiments, the display 261 may be a display in which at least one area is deformable into a planar surface or a curved surface. In certain example embodiments, the display 261 may include a folding area 261*c*, a first area 261*a* on a first side (e.g., the right side) of the folding area 261*c*, and a second area 261*b* on a second side (e.g., the left side) of the folding area 261*c*. For example, the first area 261*a* may be disposed in the first surface 211 of the first housing 210, and the second area 261*b* may be disposed in the third surface 221 of the second housing 220. However, the area division of the display 261 is merely an example, and the display 261 may be divided into a plurality of areas depending on the structure or functions of the display 261. For example, as shown in FIG. 2A, the display 261 may be divided into areas based on the folding axis A or the folding area 261*c* extending in parallel to a y-axis, or the display 261 may be divided into areas based on another folding area (e.g., a folding area extending in parallel to an x-axis) or another folding axis (e.g., a folding axis parallel to the x-axis). The area division of the display 261 as above is merely physical division based on the pair of housings 210 and 220 and the hinge, and the display 261 may display substantially one screen through the pair of housings 210 and 220 and the hinge. In certain example embodiments, the first area 261*a* may include a notch area formed along the sensor area 231 but may be substantially symmetrical to the second area 261*b* in the other areas. In certain example embodiments, the first area 261*a* and the second area 261*b* may have substantially symmetrical shapes with respect to the folding area 261*c*.

In certain example embodiments, the hinge cover 265 may be disposed between the first housing 210 and the second housing 220 and configured to cover the hinge. The hinge cover 265 may be hidden by at least a portion of the first housing 210 and the second housing 220 or exposed to the outside according to the operating state of the electronic device 201. For example, when the electronic device 201 is in an unfolded state as shown in FIG. 2A, the hinge cover 265 may be hidden by the first housing 210 and the second housing 220 and not exposed to the outside, and when the electronic device 201 is in a folded state as shown in FIG. 2B, the hinge cover 265 may be exposed to the outside between the first housing 210 and the second housing 220. Meanwhile, when the electronic device 201 is in an intermediate state in which the first housing 210 forms an angle with the second housing 220, at least a portion of the hinge cover 265 may be exposed to the outside between the first housing 210 and the second housing 220. In this case, an area of the hinge cover 265 exposed to the outside may be smaller than the area of the hinge cover 265 exposed when the electronic device 201 is in the folded state. In certain example embodiments, the hinge cover 265 may have curved surfaces.

Describing the operation of the electronic device 201, when the electronic device 201 is in an unfolded state (e.g., the state of the electronic device 201 of FIG. 2A), the first housing 210 may form a first angle (e.g., about 180 degrees) with the second housing 220, and the first area 261*a* and the second area 261*b* of the display 261 may be oriented in substantially the same direction. The folded area 261*c* of the display 261 may be on substantially the same plane as the first area 261*a* and the second area 261*b*. In certain embodiments, when the electronic device 201 is in the unfolded state, the first housing 210 may rotate at a second angle (e.g., about 360 degrees) relative to the second housing 220, whereby the first housing 210 and the second housing 220 may be reversely folded such that the second surface 212 and the fourth surface 222 may face each other. Meanwhile, when the electronic device 201 is in the folded state (e.g., the state of the electronic device 201 of FIG. 2B), the first housing 210 and the second housing 220 may face each other. The first housing 210 and the second housing 220 may form an angle of about 0 degrees to about 10 degrees, and the first area 261*a* and the second area 261*b* of the display 261 may face each other. At least a portion of the folding area 261*c* of the display 261 may be deformed into a curved surface. Meanwhile, when the electronic device 201 is in the intermediate state, the first housing 210 may form a predetermined angle with the second housing 220. An angle (e.g., a third angle, about 90 degrees) formed by the first area 261*a* and the second area 261*b* of the display 261 may be greater than that when the electronic device 201 is in the folded state and less than that when the electronic device 201 is in the unfolded state. At least a portion of the folding area 261*c* of the display 261 may be deformed into a curved surface. In this case, a curvature of the curved surface of the folding area 261*c* may be smaller than that when the electronic device 201 is in the folded state.

Meanwhile, the various example embodiments of the electronic device described herein are not limited to a form factor of the electronic device 201 described with reference to FIGS. 2A and 2B and may also apply to electronic devices with various form factors.

Figure 3:
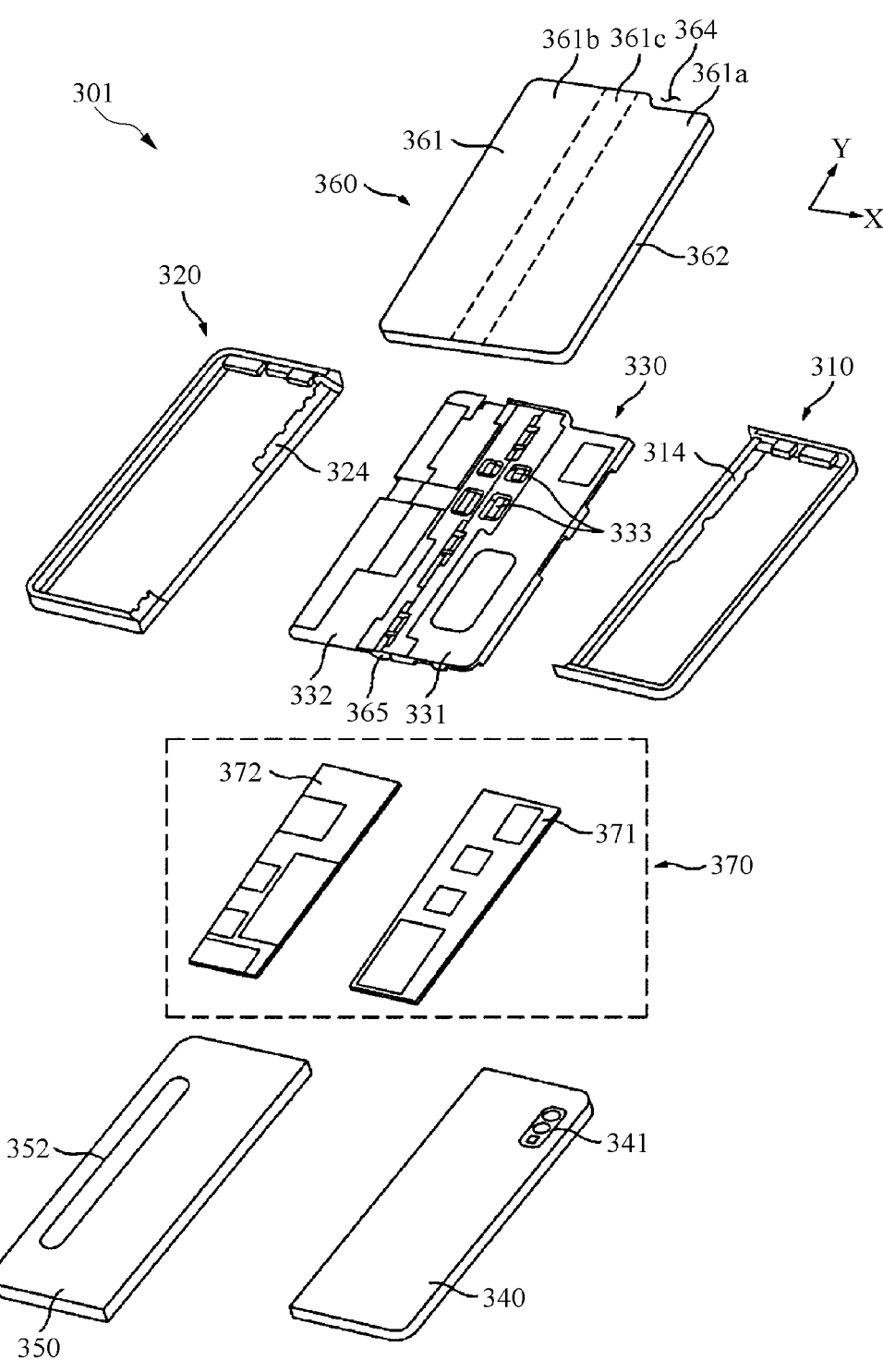
FIG. 3 is an exploded perspective view of an electronic device according to various example embodiments.
Figure 4A:
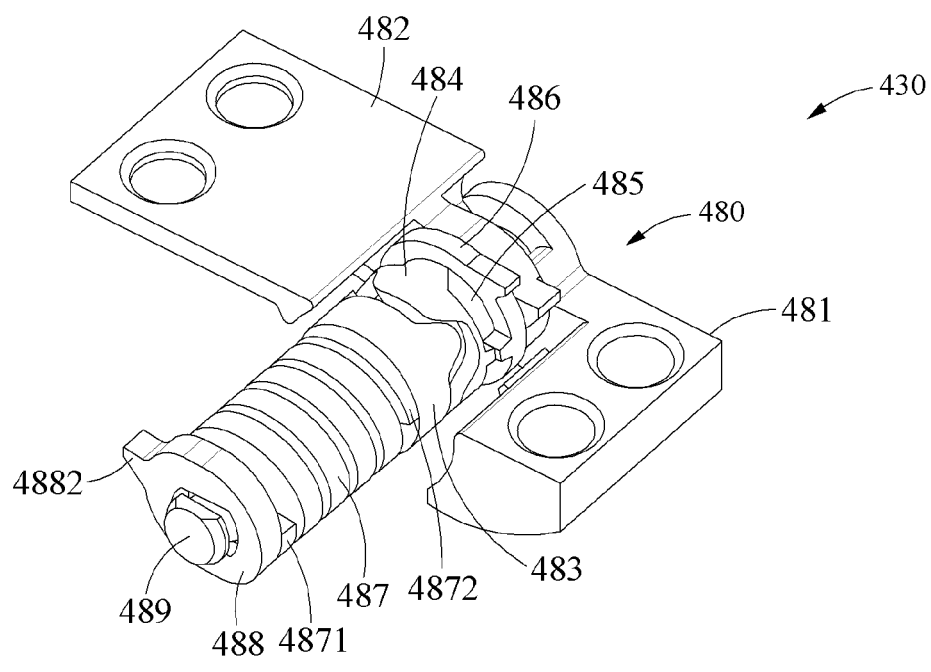
FIG. 4A is a perspective view of a hinge assembly according to an example embodiment.
Figure 4B:
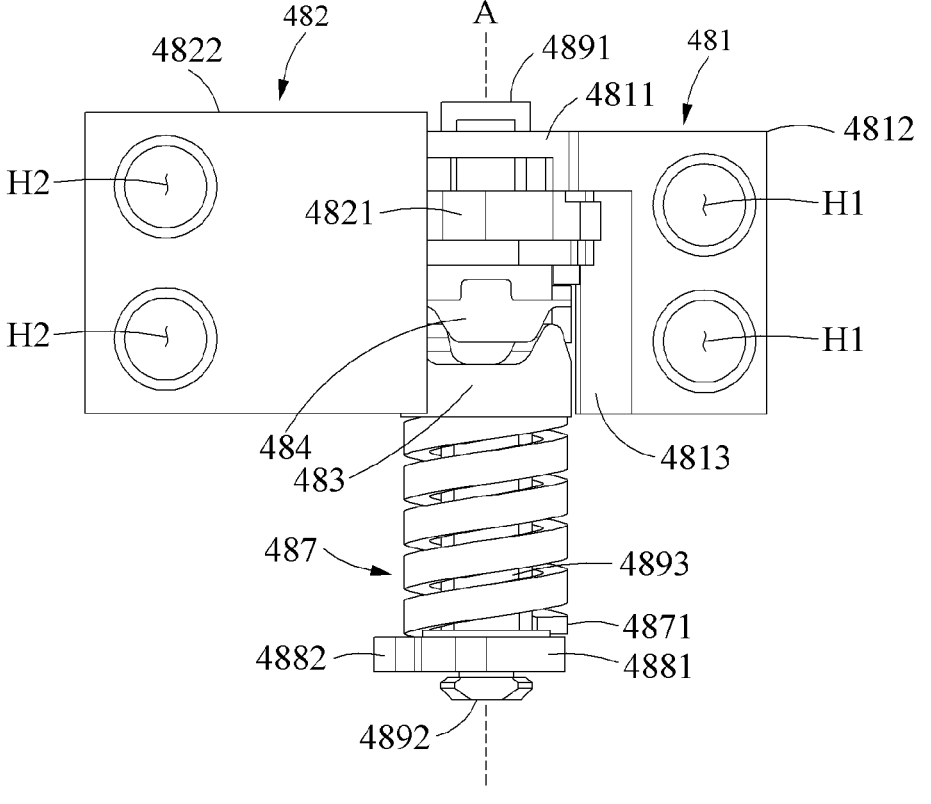
FIG. 4B is a view of the hinge assembly of FIG. 4A, viewed in a direction intersecting an axial direction of a folding axis.
Figure 4C:
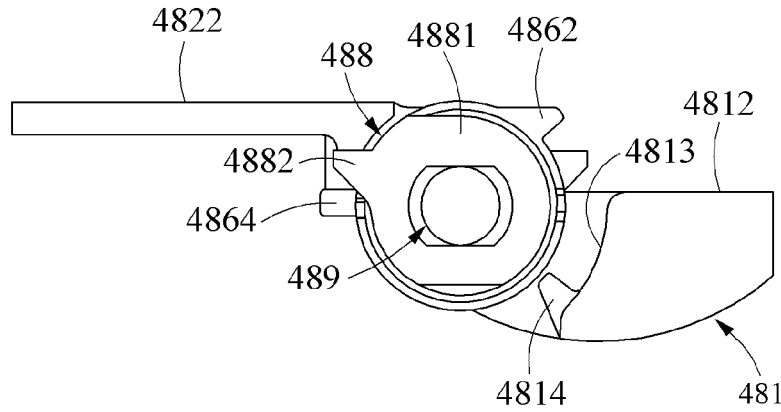
FIG. 4C is a view of the hinge assembly of FIG. 4A, viewed in the axial direction of the folding axis.
Figure 4D:
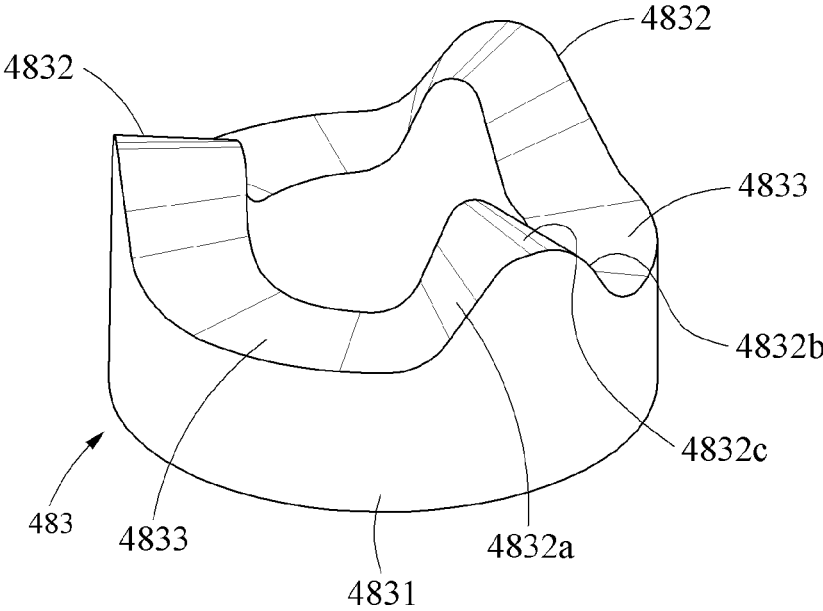
FIG. 4D is a perspective view of a first cam of the hinge assembly of FIG. 4A.
Figure 4E:
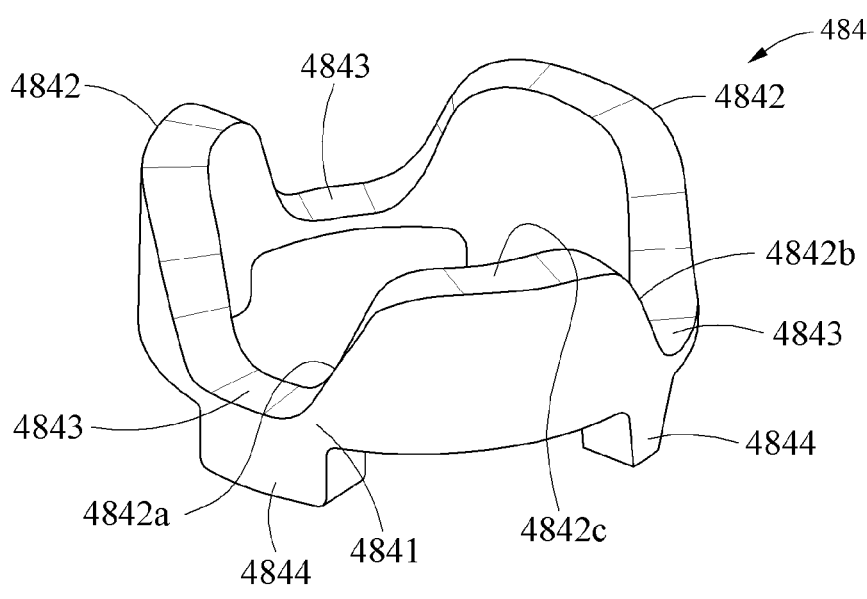
FIG. 4E is a perspective view of a second cam of the hinge assembly of FIG. 4A.
Figure 4F:
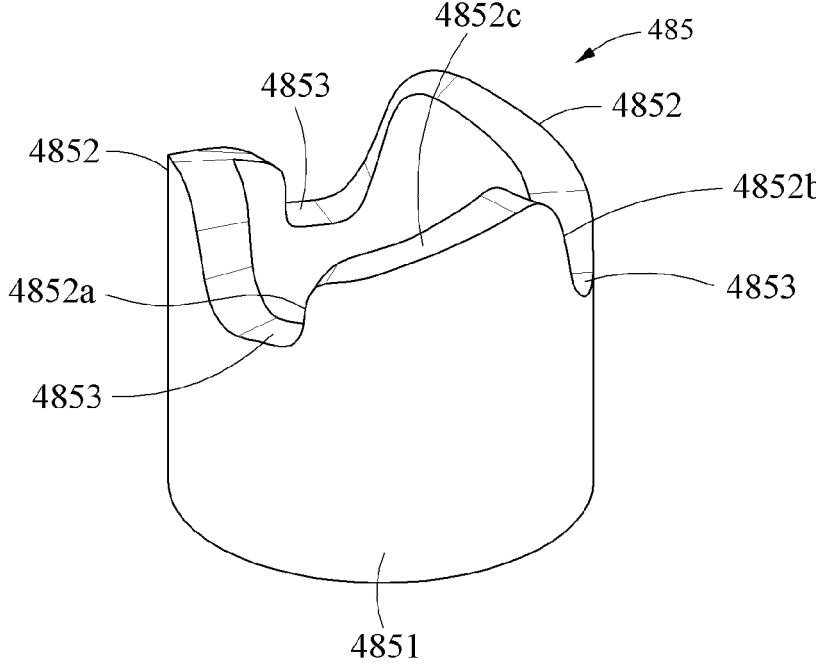
FIG. 4F is a perspective view of a third cam of the hinge assembly of FIG. 4A.
Figure 4G:
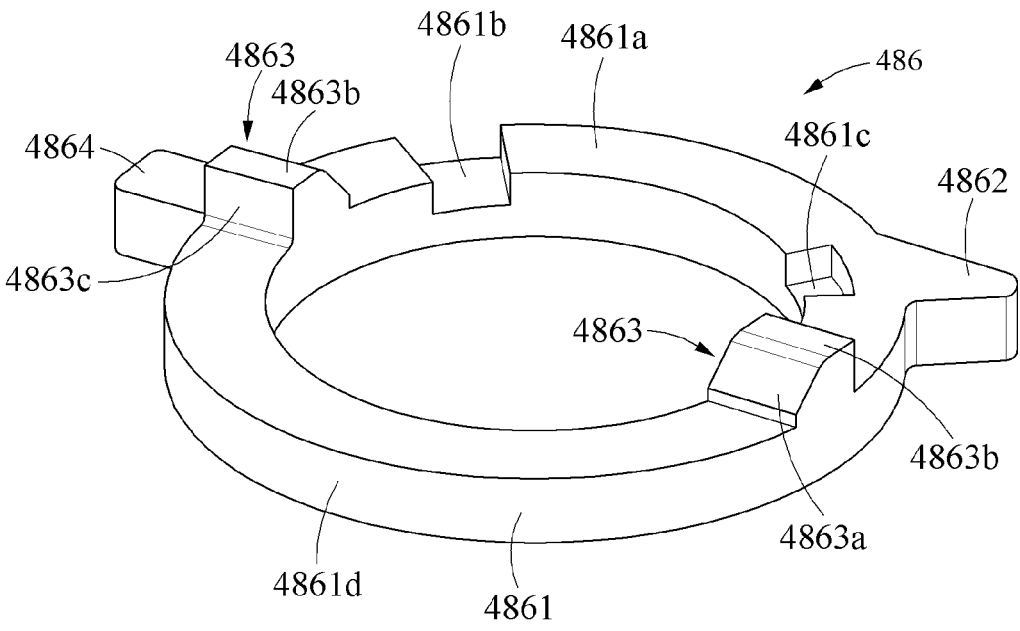
FIG. 4G is a perspective view of a support ring of the hinge assembly of FIG. 4A.
Figure 4H:
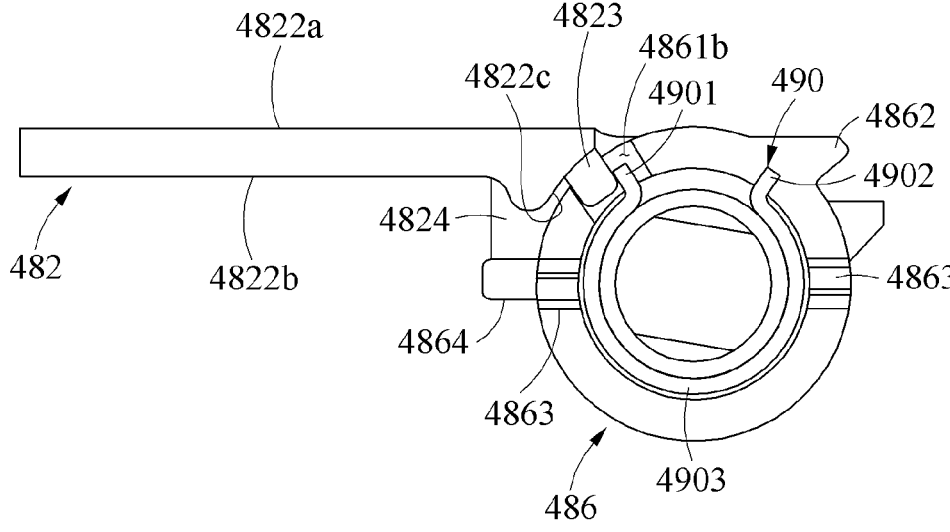
FIG. 4H is a view of a structure including a rotating body, a support ring, and a second elastic body in the hinge assembly of FIG. 4A.

Referring to FIG. 3, an electronic device 301 may include a display module 360 (e.g., the display module 160), a hinge assembly 330, a substrate 370, a first housing 310 (e.g., the first housing 210), a second housing 320 (e.g., the second housing 220), a first rear cover 340 (e.g., the first rear cover 240) including a first rear area 341 (e.g., the first rear area 241), and a second rear cover 350 (e.g., the second rear cover 250) including a second rear area 352 (e.g., the second rear area 251).

The display module 360 may include a display 361 (e.g., the display 261) and at least one layer or plate 362 on which the display 361 is seated. In certain example embodiments, the plate 362 may be disposed between the display 361 and the hinge assembly 330. The display 361 may be disposed on at least a portion of one surface (e.g., a top surface) of the plate 362. The plate 362 may be formed in a shape corresponding to the display 361. For example, a partial area of the plate 362 may be formed in a shape corresponding to a notch area 364 of the display 361.

The hinge assembly 330 may include a first bracket 331, a second bracket 332, a hinge disposed between the first bracket 331 and the second bracket 332, a hinge cover 365 for covering the hinge when viewed from the outside, and a wiring member 333 (e.g., a flexible printed circuit board (FPCB)) that traverses the first bracket 331 and the second bracket 332.

In certain example embodiments, the hinge assembly 330 may be disposed between the plate 362 and the substrate 370. For example, the first bracket 331 may be disposed between a first area 361*a* of the display 361 and a first substrate 371. The second bracket 332 may be disposed between a second area 361*b* of the display 361 and a second substrate 372.

In certain example embodiments, at least a portion of the hinge and the wiring member 333 may be disposed inside the hinge assembly 330. The wiring member 333 may be disposed in a direction (e.g., the x-axial direction) that traverses the first bracket 331 and the second bracket 332. The wiring member 333 may be disposed in a direction (e.g., the x-axial direction) perpendicular to a folding axis (e.g., the y-axis or the folding axis A of FIG. 2A) of a flexible area 361*c* of the electronic device 301.

The substrate 370 may include the first substrate 371 disposed on the first bracket 331 and the second substrate 372 disposed on the second bracket 332. The first substrate 371 and the second substrate 372 may be disposed in a space formed by the hinge assembly 330, the first housing 310, the second housing 320, the first rear cover 340, and the second rear cover 350. Components for implementing various functions of the electronic device 301 may be mounted on the first substrate 371 and the second substrate 372.

The first housing 310 and the second housing 320 may be assembled together to be coupled to both sides of the hinge assembly 330 in a state in which the display module 360 is coupled to the hinge assembly 330. The first housing 310 and the second housing 320 may be coupled to the hinge assembly 330 by sliding from both sides of the hinge assembly 330.

In certain example embodiments, the first housing 310 may include a first rotation support surface 314, and the second housing 320 may include a second rotation support surface 324 corresponding to the first rotation support surface 314. The first rotation support surface 314 and the second rotation support surface 324 may include curved surfaces corresponding to the curved surfaces included in the hinge cover 365.

In certain example embodiments, when the electronic device 301 is in an unfolded state (e.g., the electronic device 201 of FIG. 2A), the first rotation support surface 314 and the second rotation support surface 324 may cover the hinge cover 365 such that the hinge cover 365 may not be exposed through the rear surface of the electronic device 301 or may be minimally exposed. Meanwhile, when the electronic device 301 is in a folded state (e.g., the electronic device 201 of FIG. 2B), the first rotation support surface 314 and the second rotation support surface 324 may rotate along the curved surfaces included in the hinge cover 365 such that the hinge cover 365 may be maximally exposed through the rear surface of the electronic device 301.

Referring to FIGS. 4A to 4G, a hinge assembly 430 (e.g., the hinge assembly 330) may include a hinge cover (e.g., the hinge cover 365), and a hinge 480 connected to the hinge cover to support a display (e.g., the first area 361*a* and/or the second area 361*b* of the display 361). The hinge 480 may allow an electronic device (e.g., the electronic device 201) to be unfolded without going through a stop section when unfolded by a motion of a user and allow the electronic device to be folded going through the stop section when folded by a motion of the user. The hinge 480 may include a fixing body 481, a rotating body 482, a first cam 483, a second cam 484, a third cam 485, a support ring 486, a first elastic body 487, a support body 488, a shaft 489, and a second elastic body 490.

The shaft 489 may be positioned on at least a portion of the hinge cover (e.g., the hinge cover 365) and extend in one direction (e.g., the Y-axial direction of FIG. 3) of the hinge cover. The shaft 489 may include a first end 4891 (e.g., an upper end when viewed in FIG. 4B), a second end 4892 (e.g., a lower end when viewed in FIG. 4B) opposite the first end 4891, and an extension 4893 extending between the first end 4891 and the second end 4892. The extension 4893 may have a folding axis A (e.g., the folding axis A of FIG. 2).

The support body 488 may support the shaft 489 with respect to the hinge cover (e.g., the hinge cover 365). In certain example embodiments, the support body 488 may include a substantially annular support base 4881 connected to the second end 4892 of the shaft 489, and a contact protrusion 4882 positioned on at least a portion of the circumference of the support base 4881 and configured to protrude from the support base 4881 in a radial direction and contact the hinge cover.

The first elastic body 487 may apply an elastic force to the first cam 483. In certain example embodiments, the first elastic body 487 may be positioned between the first end 4891 and the second end 4892 of the shaft 489 to surround the extension 4893. In certain example embodiments, the first elastic body 487 may be stretched or compressed along the extension 4893. In certain example embodiments, the first elastic body 487 may be a compression spring. In certain example embodiments, a first end 4871 of the first elastic body 487 may be connected to the support base 4881, and a second end 4872, opposite the first end 4871, of the first elastic body 487 may be connected to the first cam 483.

The fixing body 481 may fix the shaft 489 to the hinge cover (e.g., the hinge cover 365). In certain example embodiments, the fixing body 481 may include a substantially annular fixing base 4811 connected to the first end 4891 of the shaft 489, and a fixing plate 4812 having at least one first fixing hole H1 for fixing the fixing plate 4812 to the hinge cover. In certain example embodiments, the fixing body 481 may include a curved surface portion 4813 spaced apart from the shaft 489 in a radial direction of the shaft 489 and surround at least a portion of the shaft 489. In certain example embodiments, the curved surface portion 4813 may be integrally formed seamlessly with the fixing plate 4812. In certain example embodiments, the fixing body 481 may include a first stopper 4814 for stopping the rotation of the support ring 486. The first stopper 4814 may be formed on at least a portion of the curved surface portion 4813 and protrude from at least a portion of the curved surface portion 4813 toward the shaft 489 in a normal direction of the curved surface portion 4813. In certain example embodiments, the first stopper 4814 may be integrally formed seamlessly with the curved surface portion 4813.

The rotating body 482 may support a display (e.g., the display 361). In certain example embodiments, the rotating body 482 may include a substantially annular rotating base 4821 rotatably connected to the shaft 489, and a rotating plate 4822 having at least one second fixing hole H2 for fixing the rotating plate 4822 to a bracket (e.g., the first bracket 331 and/or the second bracket 332) supporting one area (e.g., the first area 361a and/or the second area 361b) of the display. In certain example embodiments, the rotating base 4821 may be formed integrally and seamlessly with the rotating plate 4822. The rotating plate 4822 may include a first surface 4822a (e.g., a top surface based on FIG. 4H), a second surface 4822b (e.g., a bottom surface based on FIG. 4H) opposite the first surface 4822a, and a third surface 4822c (e.g., a left curved surface based on FIG. 4H) between the first surface 4822a and the second surface 4822b. In certain example embodiments, the rotating body 482 may include a fixing protrusion 4823 formed on the third surface 4822c of the rotating plate 4822, and a second stopper 4824 formed on the second surface 4822b of the rotating plate 4822.

The first cam 483 may be configured to perform a linear motion along the folding axis A of the shaft 489. In certain example embodiments, the first cam 483 may perform the linear motion while elastically moving by means of the first elastic body 487 in the axial direction of the folding axis A of the shaft 489 when the first elastic body 487 is stretched or compressed in the axial direction of the folding axis A of the shaft 489. In certain example embodiments, the first cam 483 may be configured to selectively contact any one of the second cam 484 and the third cam 485. In other words, the first cam 483 may not contact the third cam 485 when the first cam 483 contacts the second cam 484, and the first cam 483 may contact the third cam 485 when the first cam 483 does not contact the second cam 484. In certain example embodiments, the first cam 483 may release the contact with the second cam 484 and then contact the third cam 485. In certain example embodiments, the first cam 483 may release the contact with the third cam 485 and then contact the second cam 484.

The first cam 483 may include a first cam body 4831 and a first cam surface 4832. The first cam body 4831 may surround the shaft 489. The first cam surface 4832 may contact the second cam 484 and/or the third cam 485. In certain example embodiments, the first cam body 4831 may have a substantially hollow cylindrical shape, and the first cam surface 4832 may be formed on one surface (e.g., a top surface) of the first cam body 4831 in a circumferential direction of the first cam body 4831.

In certain example embodiments, the first cam 483 may include a plurality (e.g., three) of first cam surfaces 4832, and a plurality (e.g., three) of first cam notches 4833 between the plurality of first cam surfaces 4832. The plurality of first cam surfaces 4832 may be spaced apart from each other on one surface (e.g., the top surface) of the first cam body 4831 in the circumferential direction of the first cam body 4831. The plurality of first cam notches 4833 may form at least a portion of one surface (e.g., the top surface) on the circumference of the first cam body 4831.

In certain example embodiments, the first cam surface 4832 may include a first inclined portion 4832a that is inclined with respect to one first cam notch 4833 of a pair of adjacent first cam notches 4833, a second inclined portion 4832b that is inclined with respect to the other first cam notch 4833 of the adjacent first cam notches 4833, and a substantially rounded portion 4832c between the first inclined portion 4832a and the second inclined portion 4832b. In certain example embodiments, a slope of the first inclined portion 4832a and a slope of the second inclined portion 4832b may be substantially the same. In certain example embodiments, the first inclined portion 4832a and the second inclined portion 4832b may be substantially symmetrical based on the rounded portion 4832c.

In certain example embodiments, the plurality of first cam notches 4833 may be formed substantially invariable (e.g., horizontal) in the circumferential direction of the first cam body 4831.

The second cam 484 may be configured to contact the first cam 483. The second cam 484 may include a second cam body 4841 and a second cam surface 4842. The second cam body 4841 may surround the shaft 489. The second cam surface 4842 may be configured to contact the first cam surface 4832. In certain example embodiments, the second cam body 4841 may have a substantially hollow cylindrical shape, and the second cam surface 4842 may be formed on one surface (e.g., a top surface) of the second cam body 4841 in a circumferential direction of the second cam body 4841.

In certain example embodiments, the second cam 484 may include a plurality (e.g., three) of second cam surfaces 4842, and a plurality (e.g., three) of second cam notches 4843 between the plurality of second cam surfaces 4842. The plurality of second cam surfaces 4842 may be arranged to be spaced apart from each other on one surface (e.g., the top surface) of the second cam body 4841 in the circumferential direction of the second cam body 4841. The plurality of second cam notches 4843 may form at least a portion of one surface (e.g., the top surface) on the circumference of the second cam body 4841. In certain example embodiments, the plurality of second cam notches 4843 may be formed substantially invariable (e.g., horizontal) in the circumferential direction of the second cam body 4841.

In certain example embodiments, the second cam surface 4842 may include a first variable portion 4842a whose height is variable with respect to one second cam notch 4843 of a pair of adjacent second cam notches 4843, a second variable portion 4842b whose height is variable with respect to the other second cam notch 4843 of the pair of adjacent second cam notches 4843, and a non-variable portion 4842c between the first variable portion 4842a and the second variable portion 4842b and whose height is substantially invariable with respect to the pair of adjacent second cam notches 4843.

In certain embodiments, the second cam surface 4842 may include an intermediate variable portion 4842c between the first variable portion 4842a and the second variable portion 4842b and whose height is variable with respect to the pair of adjacent second cam notches 4843. To compensate for or offset a repulsive force that unfolds the display (e.g., the display 361), the intermediate variable portion 4842*c* may have a shape that increases in height with respect to a second cam notch 4843 in a direction from the first variable portion 4842*a* toward the second variable portion 4842*b*. In certain example embodiments, a slope of the intermediate variable portion 4842*c* of the second cam surface 4842 with respect to the second cam notch 4843 may be smaller than a slope of the first variable portion 4842*a* and a slope of the second variable portion 4842*b* with respect to the second cam notch 4843.

In certain example embodiments, a change in the height of the first variable portion 4842*a* and/or a change in the height of the second variable portion 4842*b* with respect to a pair of adjacent second cam notches 4843 may be substantially constant. In other words, each of the first variable portion 4842*a* and the second variable portion 4842*b* may have a surface with a substantially linear profile. In certain embodiments, the first variable portion 4842*a* and the second variable portion 4842*b* may have a curved profile with a substantially varying change in height. In certain example embodiments, a change in the height of the first variable portion 4842*a* may be substantially the same as a change in the height of the second variable portion 4842*b*. In certain embodiments, a change in the height of the first variable portion 4842*a* may be different from a change in the height of the second variable portion 4842*b*.

In certain example embodiments, the slope of the first variable portion 4842*a* and the slope of the second variable portion 4842*b* with respect to a pair of adjacent second cam notches 4843 may be substantially the same. In certain example embodiments, the slope of the first variable portion 4842*a* may be different the slope of the second variable portion 4842*b* with respect to a pair of adjacent second cam notches 4843.

In certain example embodiments, a position between the first variable portion 4842*a* and the non-variable portion 4842*c* may be defined as a first freestop position of an electronic device (e.g., the electronic device 201), and a portion between the second variable portion 4842*b* and the non-variable portion 4842*c* may be defined as a second freestop position of the electronic device. When the first cam surface 4832 is at the first freestop position, a first housing (e.g., the first housing 210) and a second housing (e.g., the second housing 220) of the electronic device (e.g., the electronic device 201) may form a first angle (e.g., about 140 degrees). When the first cam surface 4832 is at the second freestop position, the first housing (e.g., the first housing 210) and the second housing (e.g., the second housing 220) of the electronic device (e.g., the electronic device 201) may form a second angle (e.g., about 80 degrees). When the first cam surface 4832 is at a predetermined position between the first freestop position and the second freestop position, that is, when the first cam surface 4832 stays at a predetermined position of the non-variable portion 4842*c* while contacting the non-variable portion 4842*c*, the first housing (e.g., the first housing 210) and the second housing (e.g., the second housing 220) of the electronic device may form a predetermined angle between the first angle and the second angle and maintain the formed angle, thereby implementing a freestop of the electronic device.

In certain example embodiments, the second cam 484 may include a protruding portion 4844. The protruding portion 4844 may contact at least a portion of the support ring 486. The protruding portion 4844 may be formed on the other surface (e.g., a bottom surface) of the second cam body

4841 in the circumferential direction and protrude from the surface in a normal direction of the surface. In certain example embodiments, a plurality (e.g., three) of protruding portions 4844 may be provided, and the plurality of protruding portions 4844 may be spaced apart from each other on the other surface (e.g., the bottom surface) of the second cam body 4841 in the circumferential direction of the second cam body 4841. In certain example embodiments, the positions of the plurality of protruding portion 4844 formed in the circumferential direction of the second cam body 4841 may be different from the positions of the plurality of second cam surfaces 4842 formed in the circumferential direction of the second cam body 4841. For example, the plurality of protruding portions 4844 and the plurality of second cam notches 4843 may be formed at the same circumferential positions.

The third cam 485 may be configured to contact the first cam 483. The third cam 485 may include a third cam body 4851 and a third cam surface 4852. The third cam body 4851 may surround the shaft 489. The third cam surface 4852 may be configured to contact the first cam surface 4832. In certain example embodiments, the third cam body 4851 may have a substantially hollow cylindrical shape, and the third cam surface 4852 may be formed on one surface (e.g., a top surface) of the third cam body 4851 in a circumferential direction of the third cam body 4851.

In certain example embodiments, the third cam 485 may include a plurality (e.g., three) of third cam surfaces 4852, and a plurality (e.g., three) of third cam notches 4853 between the plurality of third cam surfaces 4852. The plurality of third cam surfaces 4852 may be spaced apart from each other on one surface (e.g., the top surface) of the third cam body 4851 in the circumferential direction of the third cam body 4851. The plurality of third cam notches 4853 may form at least a portion of one surface (e.g., the top surface) on the circumference of the third cam body 4851. In certain example embodiments, the plurality of third cam notches 4853 may be formed substantially invariable (e.g., horizontal) in the circumferential direction of the third cam body 4851.

In certain example embodiments, the third cam surface 4852 may include a third variable portion 4852*a* whose height is variable with respect to one third cam notch 4853 of a pair of adjacent third cam notches 4853, a fourth variable portion 4852*b* whose height is variable with respect to the other third cam notch 4853 of the pair of adjacent third cam notches 4853, and a fifth variable portion 4852*c* between the third variable portion 4852*a* and the fourth variable portion 4852*b* and whose height is variable with respect to the pair of adjacent third cam notches 4853.

In certain example embodiments, a change in the height of the third variable portion 4852*a*, a change in the height of the fourth variable portion 4852*b*, and/or a change in the height of the fifth variable portion 4852*c* with respect to a pair of adjacent third cam notches 4853 may be substantially constant. In other words, each of the third variable portion 4852*a*, the fourth variable portion 4852*b*, and the fifth variable portion 4852*c* may have a surface with a substantially linear profile. In certain embodiments, at least one of the third variable portion 4852*a*, the fourth variable portion 4852*b*, and the fifth variable portion 4852*c* may have a curved profile with a substantially varying change in height. For example, a change in the height of the fifth variable portion 4852*c* may vary when viewed in the circumferential direction of the third cam body 4851. In certain example embodiments, a change in the height of the fifth variable portion 4852*c* adjacent to the third variable portion 4852*a* may be smaller than a change in the height of the fifth variable portion 4852c adjacent to the fourth variable portion 4852b. In certain example embodiments, a change in the height of the third variable portion 4852a may be substantially the same as a change in the height of the fourth variable portion 4852b. In certain embodiments, a change in the height of the third variable portion 4852a may be different from a change in the height of the fourth variable portion 4852b.

In certain example embodiments, a slope of the third variable portion 4852a, a slope of the fourth variable portion 4852b, and a slope of the fifth variable portion 4852c with respect to a pair of adjacent third cam notches 4853 may be different from each other. For example, the third variable portion 4852a may have a first slope that is positive, the fourth variable portion 4852b may have a second slope that is negative, the fifth variable portion 4852c may have a third slope that is negative. In certain embodiments, the slope of the third variable portion 4852a and the slope of the fourth variable portion 4852b may be substantially the same, and the slopes may be different from the slope of the fifth variable portion 4852c.

In certain example embodiments, the fifth variable portion 4852c of the third cam surface 4852 may guide the first cam surface 4832 from the fourth variable portion 4852b toward the third variable portion 4852a when in contact with the first cam surface 4832. When the first housing (e.g., the first housing 210) and the second housing (e.g., the second housing 220) of the electronic device (e.g., the electronic device 201) form a third angle (e.g., about 10 degrees), the first cam surface 4832 may be on the fifth variable portion 4852c at a position adjacent to the fourth variable portion 4852b, and while the first housing (e.g., the first housing 210) and the second housing (e.g., the second housing 220) form a fourth angle (e.g., about 180 degrees) greater than the third angle, the first cam surface 4832 may be guided along the fifth variable portion 4852c toward the third variable portion 4852a. The shape of the third cam surface 4852 as described above may allow the electronic device to be unfolded by a single motion of a user without staying at a stop section where the hinge 480 implements a freestop.

In certain example embodiments, a radial distance between the second cam 484 and the shaft 489 may be greater than a radial distance between the third cam 485 and the shaft 489. In other words, the second cam 484 may be positioned further from the shaft 489 than the third cam 485. In certain embodiments, the radial distance between the second cam 484 and the shaft 489 may be less than the radial distance between the third cam 485 and the shaft 489, which may be understood as that the second cam 484 is positioned closer to the shaft 489 than the third cam 485.

The support ring 486 may support the second cam 484 and/or the third cam 485. The support ring 486 may include a ring body 4861. The ring body 4861 may support the second cam body 4841 of the second cam 484 and/or the third cam body 4851 of the third cam 485. The ring body 4861 may surround the shaft 489. The ring body 4861 may be connected to the rotating base 4821 of the rotating body 482, and while the rotating base 4821 rotates about the shaft 489 (e.g., about the folding axis A), the ring body 4861 may also rotate about the shaft 489 along with the second elastic body 490 and the rotating base 4821. In certain example embodiments, the ring body 4861 may have a substantially annular shape having a circumferential surface 4861a and a radial surface 4861d. In certain example embodiments, the ring body 4861 may include a first recess 4861b and a second recess 4861c formed in the circumferential surface 4861a. The first recess 4861b may accommodate at least a portion of the fixing protrusion 4823 of the rotating body 482 and a first portion of the second elastic body 490 (e.g., a first end 4901 of the second elastic body 490). The second recess 4861c may accommodate a second portion, different from the first portion, of the second elastic body 490 (e.g., a second end 4902 of the second elastic body 490). The first recess 4861b may be formed to be spaced apart the second recess 4861c in the circumferential direction of the ring body 4861.

In certain example embodiments, the support ring 486 may include a stopping protrusion 4862 configured to meet the stopper 4814 of the fixing body 481. The stopping protrusion 4862 may be formed on the radial surface 4861d of the ring body 4861. In certain example embodiments, the stopping protrusion 4862 may protrude from the radial surface 4861d of the ring body 4861 in one direction (e.g., a tangential direction). When the stopping protrusion 4862 meets the first stopper 4814, the ring body 4861 may stop rotating about the shaft 489 (e.g., about the folding axis A), and the rotating base 4821 may rotate about the shaft 489. In other words, when the stopping protrusion 4862 meets the stopper 4814, the ring body 4861 may rotate in a direction (e.g., a counterclockwise direction based on FIG. 4H) opposite to the direction of rotation about the shaft 489 (e.g., the rotation direction of the rotating body 482, a clockwise direction based on FIG. 4H).

In certain example embodiments, the support ring 486 may include a support protrusion 4863 configured to support the second cam body 4841 and/or the protruding portion 4844. The support protrusion 4863 may be formed on the circumferential surface 4861a of the ring body 4861. In certain example embodiments, the support ring 486 may include a plurality of (e.g., two) support protrusions 4863. The plurality of support protrusions 4863 may be spaced apart from each other on the circumference of the ring body 4861. In certain example embodiments, the plurality of support protrusions 4863 may be positioned to face each other on the circumference of the ring body 4861.

In certain example embodiments, the support protrusion 4863 may include an inclined surface 4863a that is inclined with respect to the ring body 4861, a horizontal surface 4863b that is substantially horizontal to the ring body 4861, and a vertical surface 4863c that is substantially vertical to the ring body 4861. The horizontal surface 4863b may be positioned between the inclined surface 4863a and the vertical surface 4863c. In certain example embodiments, the horizontal surface 4863b may be configured to support the protruding portion 4844 of the second cam 484. In certain example embodiments, the horizontal surface 4863b may be configured not to support the protruding portion 4844 of the second cam 484, and at this time, the inclined surface 4863a may guide the protruding portion 4844 of the second cam 484 to one surface (e.g., the top surface) on the circumference of the ringing body 4861, and the ring body 4861 may support the protruding portion 4844 of the second cam 484. In certain example embodiments, the inclined surface 4863a may be configured to guide the protruding portion 4844 of the second cam 484 positioned on one circumferential surface (e.g., the top surface) of the ring body 4861 onto the horizontal surface 4863b, and at this time, the horizontal surface 4863b may support the protruding portion 4844 of the second cam 484.

In certain example embodiments, the support ring 486 may include a radial protrusion 4864 radially protruding from the radial surface 4861d of the ring body 4861. The radial protrusion 4864 may be configured to meet the second stopper 4824 while the rotating plate 4822 rotates about the shaft 489 in one direction (e.g., a clockwise direction based on FIG. 4H). When the radial protrusion 4864 meets the second stopper 4824, the support ring 486 may rotate along with the second elastic body 490 and the rotating plate 4822 until the stopping protrusion 4862 meets the first stopper 4814.

The second elastic body 490 may generate a torsional force in the support ring 486. In certain example embodiments, the second elastic body 490 may include a first end 4901 fixed or connected to the fixing protrusion 4823 of the rotating body 482 and accommodated in the first recess 4861b formed in the circumferential surface 4861a of the ring body 4861, a second end 4902 accommodated in the second recess 4861c formed in the circumferential surface 4861a of the ring body 4861, and a circumferential extension 4903 extending in the circumferential direction of the ring body 4861 between the first end 4901 and the second end 4902 and inside the support protrusions 4863. The second elastic body 490 may be in a compressed state by a predetermined initial amount of compression when the electronic device (e.g., the electronic device 201) is in an unfolded state or a fully unfolded state and may rotate along with the rotating plate 4822 and the ring body 4861 when the ring body 4861 rotates in one direction (e.g., the clockwise direction based on FIG. 4H) and the radial protrusion 4864 meets the second stopper 4824. On the other hand, when the stopping protrusion 4862 meets the first stopper 4814 and the ring body 4861 starts to rotate in a direction opposite to the rotation direction of the rotating plate 4822, the second elastic body 490 may be compressed further than the initial amount of compression as the first end 4901 comes closer the second end 4902. Meanwhile, when the support protrusion 4863 that did not support the protruding portion 4844 starts to support the protruding portion 4844, the ring body 4861 may rotate in the original rotation direction again and return to its original initial position by the torsional force of the second elastic body 490. In certain example embodiments, the second elastic body 490 may be a torsion spring.

Hereinafter, an exemplary operation scenario of a closing operation of an electronic device (e.g., the electronic device 201) entering a stop section from a fully open state (e.g., a state of an electronic device 501 of FIG. 5A) and then operating to a fully closed state (e.g., a state of an electronic device 801 of FIG. 8A) and an opening operation of the electronic device operating at once from the fully closed state (e.g., the state of the electronic device 801 of FIG. 8A) to the fully open state (e.g., the state of the electronic device 501 of FIG. 5A) without staying in the stop section will be described. Meanwhile, the following operation scenario is an exemplary scenario, and the electronic device according to various example embodiments described herein is not limited to the following operation scenario. For example, there may also be a scenario of the electronic device entering the stop section from the fully closed state and operating to the fully open state and the electronic device operating at once from the fully open state to the fully closed state.

Referring to FIGS. 5A to 5D, when the electronic device 501 (e.g., the electronic device 201) is in a fully open state, a hinge assembly 530 (e.g., the hinge assembly 430) may be at an unfolded position at which a first area 561a (e.g., the first area 261a) and a second area 561b (e.g., the second area 261b) of a display 561 (e.g., the display 261) do not face each other. When the display 561 starts to be folded for the first area 561a and the second area 561b to face each other as a first housing 510 (e.g., the first housing 210) and a second housing 520 (e.g., the second housing 220) are folded by a motion of a user, the hinge assembly 530 may change to a folded position at which the first area 561a and the second area 561b face each other.

In the hinge assembly 530, a protruding portion 5844 (e.g., the protruding portion 4844) of a second cam 584 (e.g., the second cam 484) may be supported by a support protrusion 5863 (e.g., the support protrusion 4863) of a support ring 586 (e.g., the support ring 486), and the second cam 584 may maintain a state of a translational motion stopped for a rotating body 582 (e.g., the rotating body 482). At this time, a second cam surface 5842 (e.g., the second cam surface 4842) of the second cam 584 may be positioned on a more outer side than a third cam surface 5852 (e.g., the third cam surface 4852) of a third cam 585 (e.g., the third cam 485). Thus, a first cam surface 5832 (e.g., the first cam surface 4832) of a first cam 583 (e.g., the first cam 483) may start to contact a first variable portion (e.g., the first variable portion 4842a) of the second cam surface 5842 of the second cam 584. Here, the first cam surface 5832 may apply an open maintain torque T1 to the second cam surface 5842 by an elasticity of the first elastic body 487. The open maintain torque T1 may be defined as a moment for maintaining the electronic device 501 in a fully open state in which the first housing 510 and the second housing 520 form about 180 degrees. When the second cam 584 is supported by the support ring 586, the first cam 583 may contact the second cam 584. However, when the second cam 584 moves by a translational motion (e.g., moves downward) as the support ring 586 moves, the third cam 585 at a lower position than the second cam 584 may contact the first cam 583. Meanwhile, an example embodiment in which the second cam surface 5842 is on a more inner side than the third cam surface 5852 is also possible, and it may be understood that a cam relatively far from a folding axis (e.g., the folding axis A) may first contact the first cam surface 5832.

Meanwhile, when the display 561 starts to be folded for the first area 561a and the second area 561b to face each other as the first housing 510 and the second housing 520 are folded by a motion of a user, the radial protrusion 4864 may meet a first stopper 5824 in a state in which the support ring 586 receives a force to rotate in one direction (e.g., a clockwise direction based on FIG. 5E) due to an initial amount of compression of a second elastic body 590. Accordingly, a rotating plate 5822 (e.g., the rotating plate 4822) of the rotating body 582, the support ring 586, and the second elastic body 590 may rotate together in one direction (e.g., the clockwise direction based on FIG. 5E).

Figure 6A:
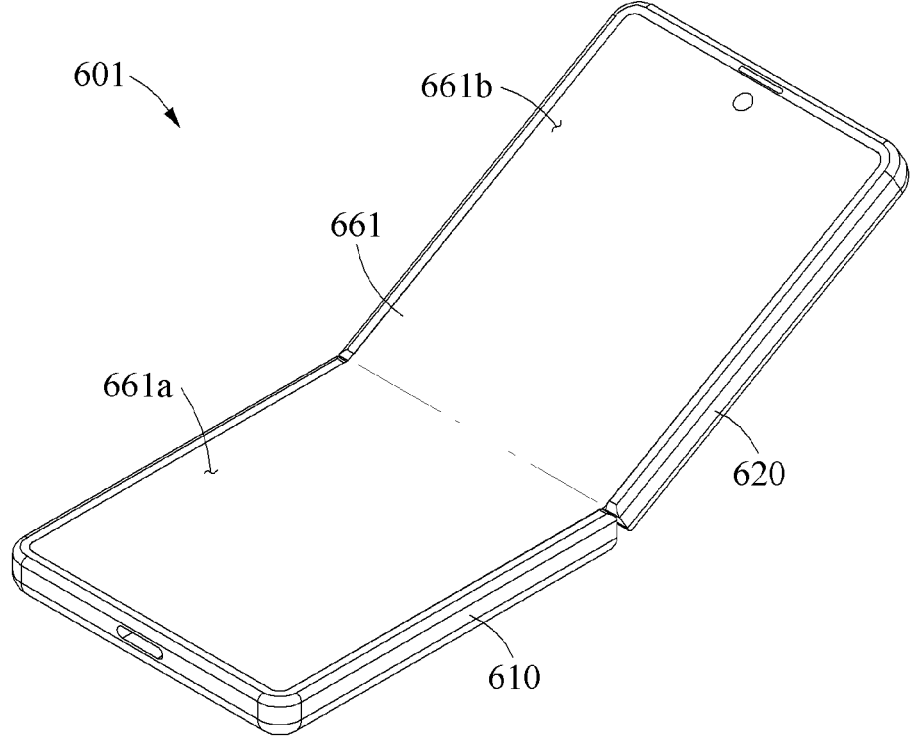
FIG. 6A is a view illustrating a first intermediate folded state of an electronic device according to an example embodiment.
Figure 6B:
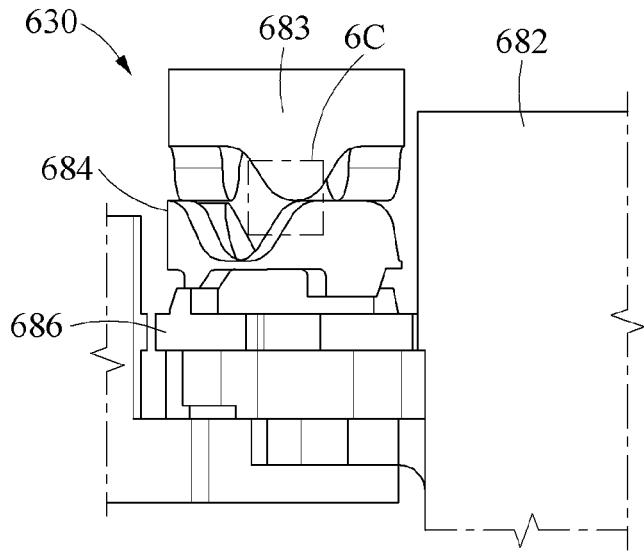
FIG. 6B is a view illustrating a portion of a hinge assembly in the first intermediate folded state of the electronic device of FIG. 6A.
Figure 6C:
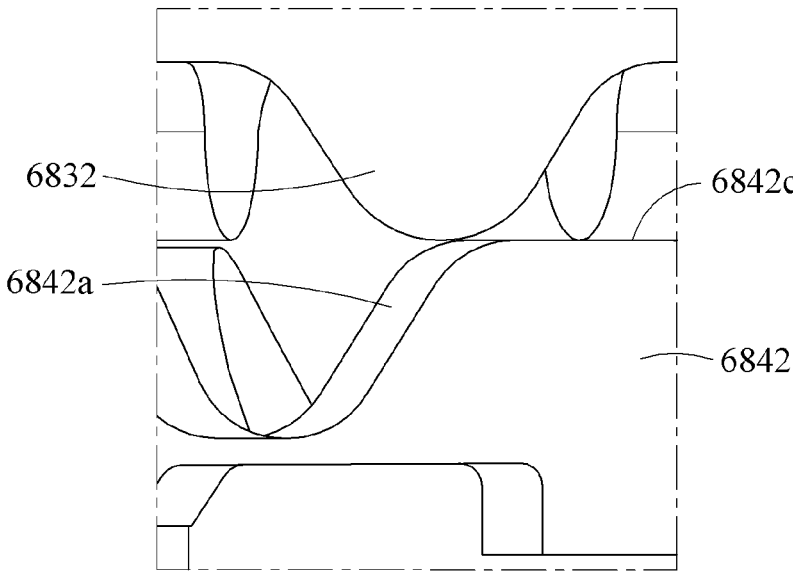
FIG. 6C is an enlarged view of a portion 6C of the hinge assembly of FIG. 6B.

Referring to FIGS. 6A to 6C, an electronic device 601 operating in a first intermediate folded state in which a first area 661a (e.g., the first area 561a) and a second area 661b (e.g., the second area 561b) of a display 661 (e.g., the display 561) are folded as a first housing 610 (e.g., the first housing 510) and a second housing 620 (e.g., the second housing 520) form a predetermined angle (e.g., about 140 degrees), after operating from a fully open state (e.g., the state of the electronic device 501 of FIG. 5A), is shown.

Figure 5A:
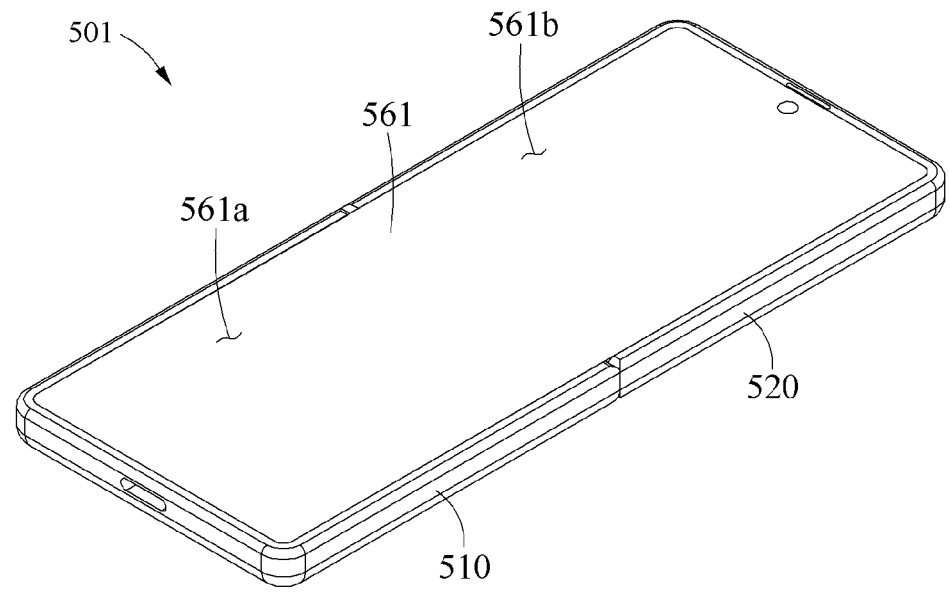
FIG. 5A is a view illustrating a fully open state of an electronic device according to an example embodiment.
Figure 5B:
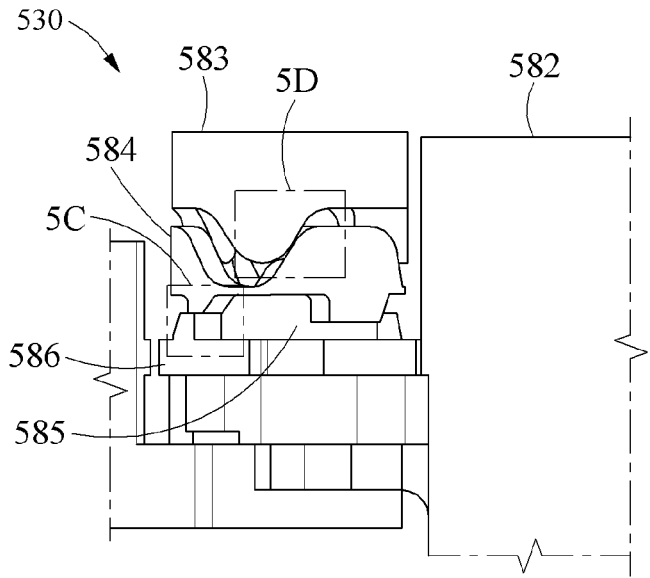
FIG. 5B is a view illustrating a portion of a hinge assembly in the fully open state of the electronic device of FIG. 5A.
Figure 5C:
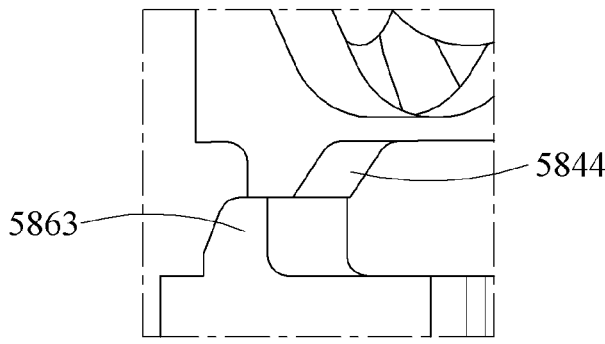
FIG. 5C is an enlarged view of a portion 5C of the hinge assembly of FIG. 5B.
Figure 5D:
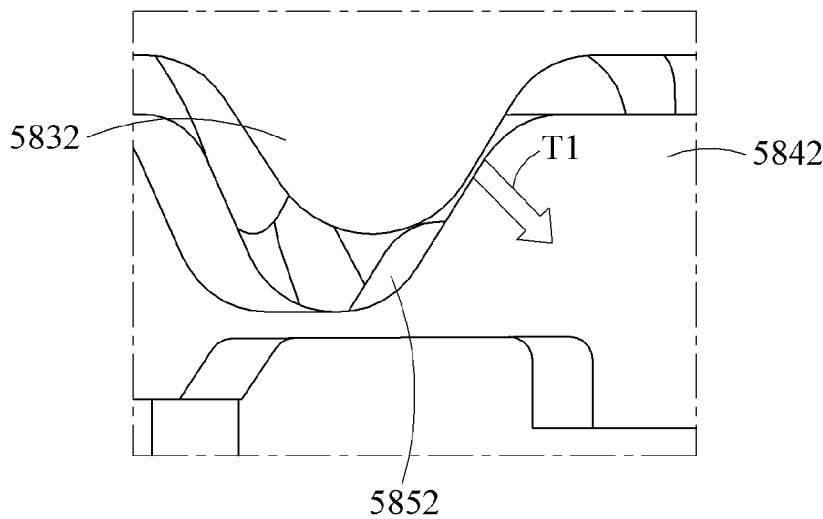
FIG. 5D is an enlarged view of a portion 5D of the hinge assembly of FIG. 5B.
Figure 5E:
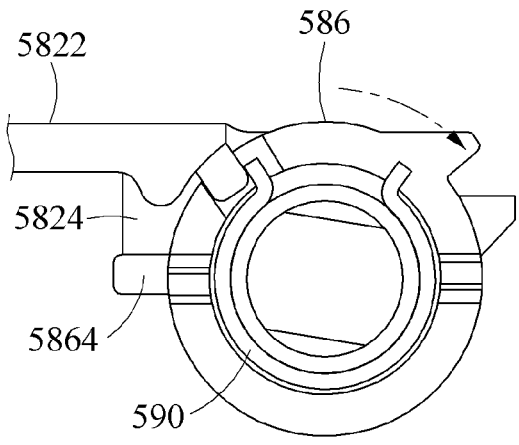
FIG. 5E is a view illustrating a state of the electronic device of FIG. 5A initiating an operation from the fully open state.

In a hinge assembly 630 (e.g., the hinge assembly 530), a second cam 684 (e.g., the second cam 584) may continuously maintain a state of a translational motion stopped for a rotating body 682 (e.g., the rotating body 582) while supported by a support ring 686 (e.g., the support ring 586), as in the state shown in FIG. 5C.

A first cam surface 6832 (e.g., the first cam surface 5832) of a first cam 683 (e.g., the first cam 583) may contact a non-variable portion 6842c (e.g., the non-variable portion 4842c) of a second cam surface 6842 (e.g., the second cam surface 5842) of the second cam 684 (e.g., the second cam 584). As an example, when the electronic device 601 is in the first intermediate folded state, the hinge assembly 630 may be at a first freestop position, and the first cam surface 6832 may be at a position adjacent to a first variable portion 6842*a* of the non-variable portion 6842*c* of the second cam surface 6842.

Meanwhile, the non-variable portion 6842*c* may substantially have no change in height. Thus, when the first cam surface 6832 is at a predetermined position of the non-variable portion 6842*c* while contacting the non-variable portion 6842*c*, a stopping operation of the electronic device 601 may be implemented at a predetermined angle (e.g., about 140 degrees) by friction between the first cam surface 6832 and the non-variable portion 6842*c*.

Figure 7A:
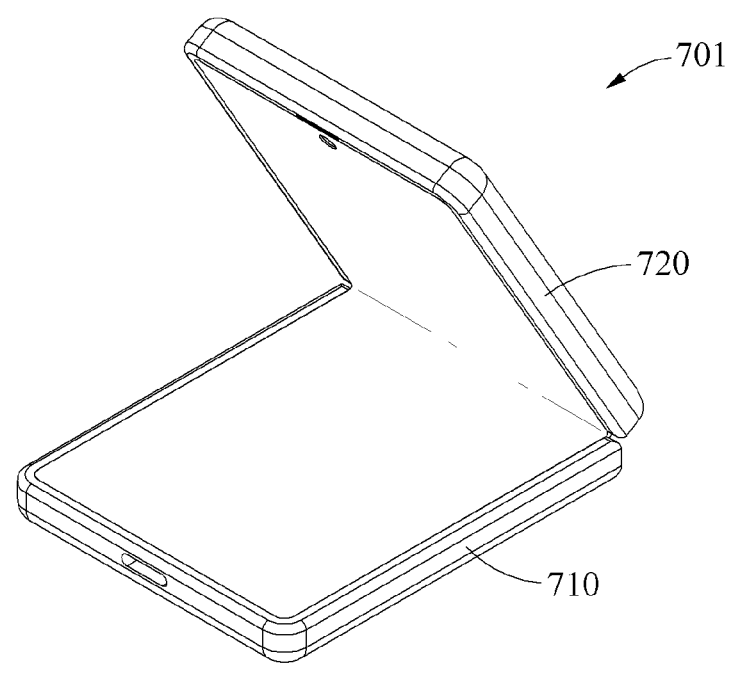
FIG. 7A is a view illustrating a second intermediate folded state of an electronic device according to an example embodiment.
Figure 7B:
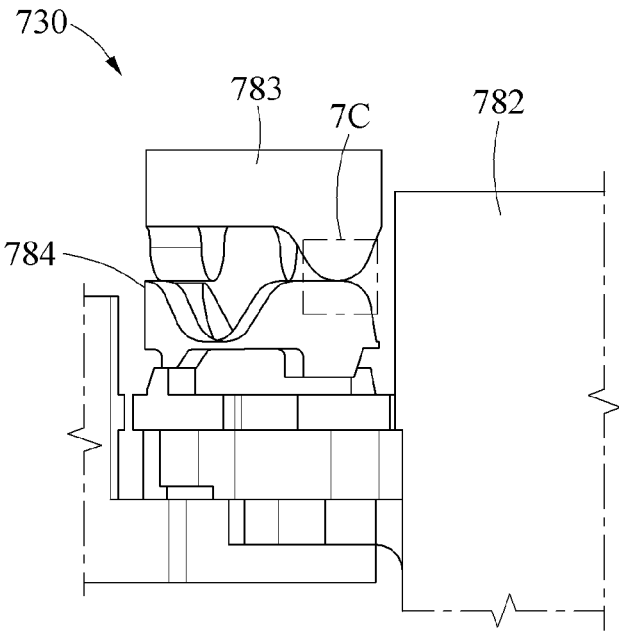
FIG. 7B is a view illustrating a portion of a hinge assembly in the second intermediate folded state of the electronic device of FIG. 7A.
Figure 7C:
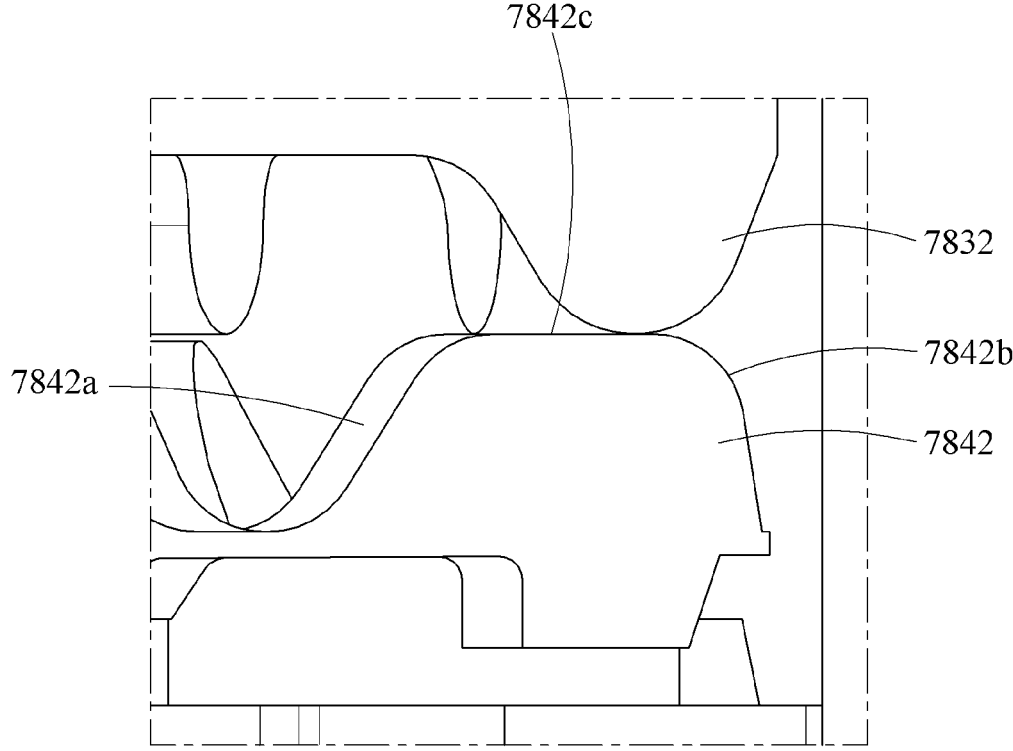
FIG. 7C is an enlarged view of a portion 7C of the hinge assembly of FIG. 7B.

Referring to FIGS. 7A to 7C, an electronic device 701 operating in a second intermediate folded state in which a first housing 710 (e.g., the first housing 610) and a second housing 720 (e.g., the second housing 620) form a predetermined angle (e.g., about 80 degrees), after operating from a first intermediate folded state (e.g., the state of the electronic device 601 of FIG. 6A), is shown.

In a hinge assembly 730 (e.g., the hinge assembly 530), a second cam 784 (e.g., the second cam 584) may continuously maintain a state of a translational motion stopped for a rotating body 782 (e.g., the rotating body 582), as in the state shown in FIG. 5C.

A first cam surface 7832 (e.g., the first cam surface 6832) of a first cam 783 (e.g., the first cam 683) may continuously contact a non-variable portion 7842*c* (e.g., the non-variable portion 6842*c*) of a second cam surface 7842 (e.g., the second cam surface 6842) of the second cam 784 (e.g., the second cam 684). As an example, while the electronic device 701 reaches the second intermediate folded state from the first intermediate folded state, the hinge assembly 730 may operate from a first freestop position to a second freestop position, and the first cam Surface 7832 may move from a position adjacent to a first variable portion 7842*a* (e.g., the first variable portion 4842*a*) of the non-variable portion 7842*c* of the second cam surface 7842 to a position adjacent to a second variable portion 7842*b* (e.g., the second variable portion 4842*b*). Further, a stopping operation of the electronic device 701 may be implemented to a predetermined angle (e.g., about 80 degrees) by friction between the first cam surface 7832 and the non-variable portion 7842*c*.

Referring to FIGS. 8A to 8E, an electronic device 801 operating in a state immediately before a fully folded state or the fully folded state in which a first housing 810 (e.g., the first housing 710) and a second housing 820 (e.g., the second housing 720) form an angle between about 0 degrees and about 10 degrees, after operating from a second intermediate folded state (e.g., the state of the electronic device 701 of FIG. 7A), is shown.

In a hinge assembly 830 (e.g., the hinge assembly 430) during the state immediately before the fully folded state of the electronic device 801, when a stopping protrusion 8862 (e.g., the stopping protrusion 4862) of a support ring 886 (e.g., the support ring 486) meets a first stopper 8814 (e.g., the first stopper 4814) of a fixing body 881 (e.g., the fixing body 481) while the support ring 886 rotates about the folding axis A, a rotating body 882 (e.g., the rotating body 482) may continuously rotate in one direction (e.g., a clockwise direction), whereas the support ring 886 may rotate in an opposite direction (e.g., a counterclockwise direction), and a second elastic body (e.g., the second elastic body 490) may be compressed further than an initial amount of compression. At this time, a second cam 884 (e.g., the second cam 584) having maintained a state of a translational motion stopped may continuously rotate about the folding axis A along with the rotating body 882, and a protruding portion 8844 (e.g., the protruding portion 5844) of the second cam 884 may not be supported by a support protrusion 8863 (e.g., the support protrusion 5863) of the support ring 886 any further and guided to one surface (e.g., a top surface) on the circumference of the support ring 886 along an inclined surface 8863*a* (e.g., the inclined surface 4863*a*) of the support protrusion 8863. Accordingly, the second cam 884 may perform a translational motion along an axial direction of the folding axis A.

Thereafter, when the electronic device 801 enters the fully folded state, the second cam 884 performing the translational motion, in the hinge assembly 830, may release the contact with a first cam 883 (e.g., the first cam 583), and a first cam surface 8832 (e.g., the first cam surface 5832) of the first cam 883 may start to contact a third cam surface 8852 (e.g., the third cam surface 4852) of a third cam 885 (e.g., the third cam 585) positioned on a more inner side than the second cam 884. Here, the first cam surface 8832 of the first cam 883 may contact a fourth variable portion 8852*b* (e.g., the fourth variable portion 4852*b*) of the third cam surface 8852.

Figure 9A:
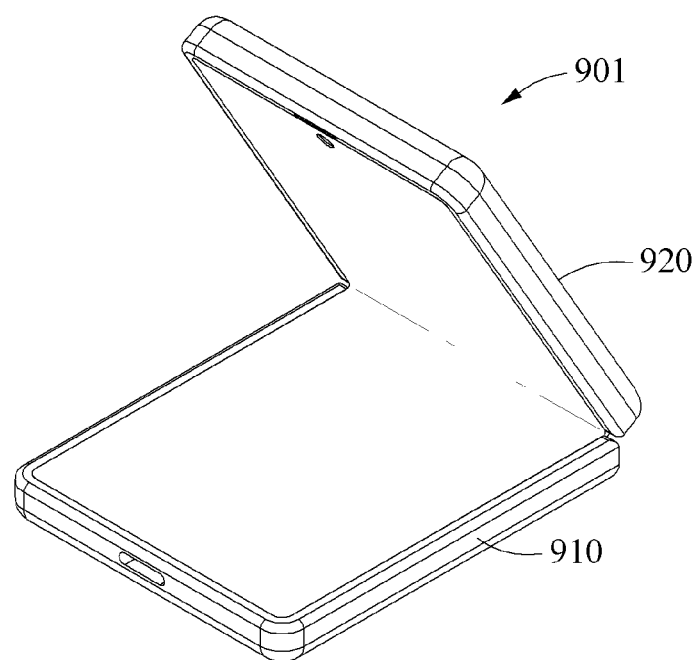
FIG. 9A is a view illustrating an intermediate unfolded state of an electronic device according to an example embodiment.
Figure 9B:
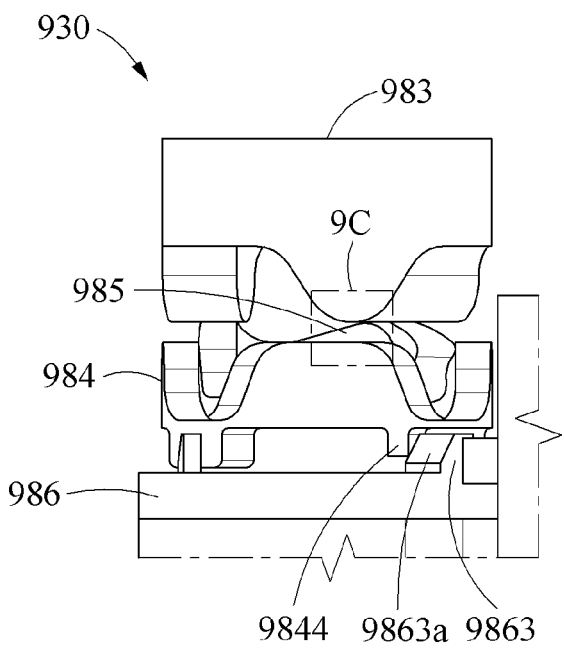
FIG. 9B is a view illustrating a portion of a hinge assembly in the intermediate unfolded state of the electronic device of FIG. 9A.
Figure 9C:
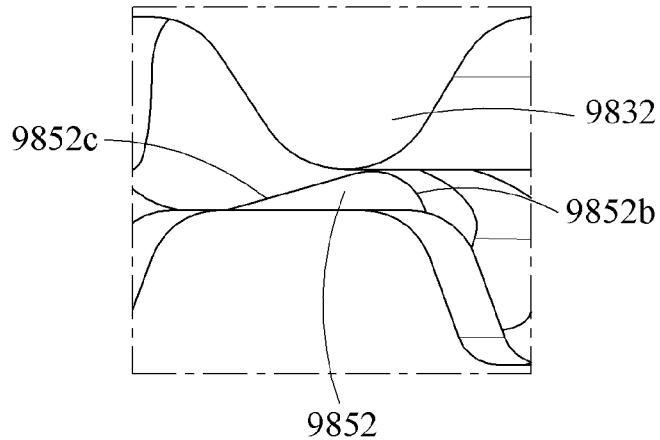
FIG. 9C is an enlarged view of a portion 9C of the hinge assembly of FIG. 9B.
Figure 10A:
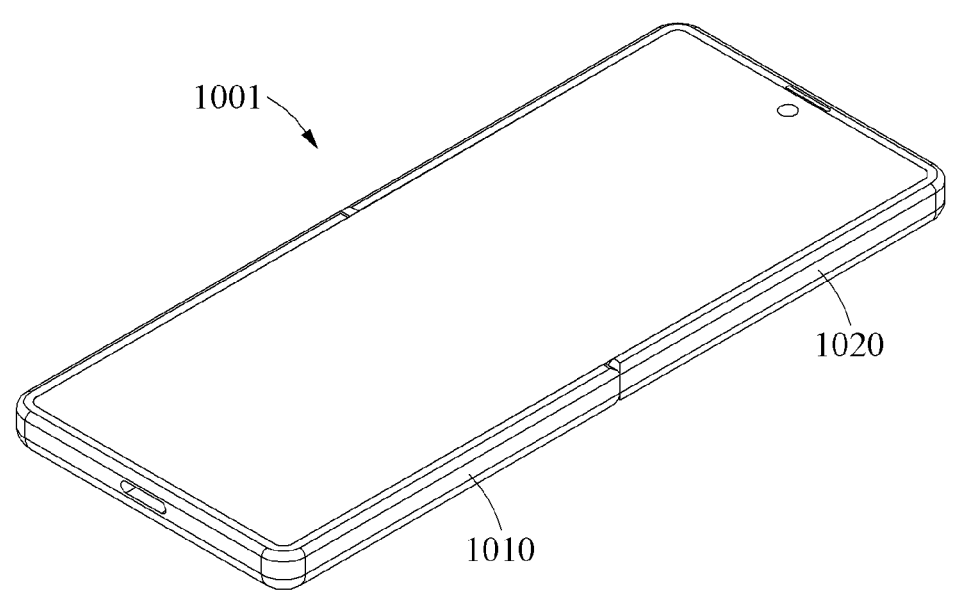
FIG. 10A is a view illustrating a fully unfolded state or a state immediately before the fully unfolded state of an electronic device according to an example embodiment.
Figure 10B:
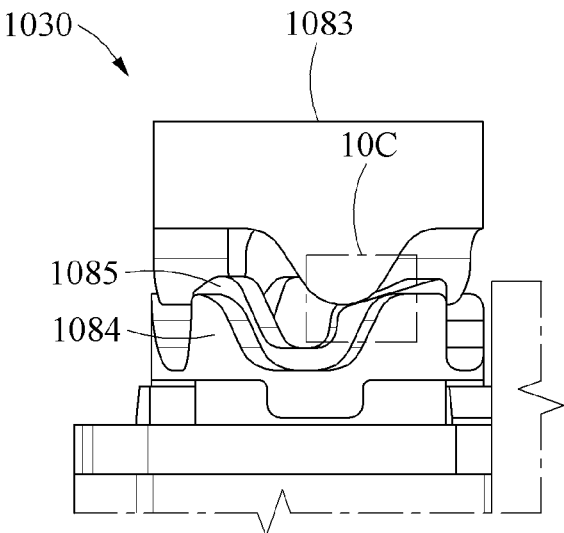
FIG. 10B is a view illustrating a portion of a hinge assembly when the electronic device of FIG. 10A is in the state immediately before the fully unfolded state.
Figure 10C:
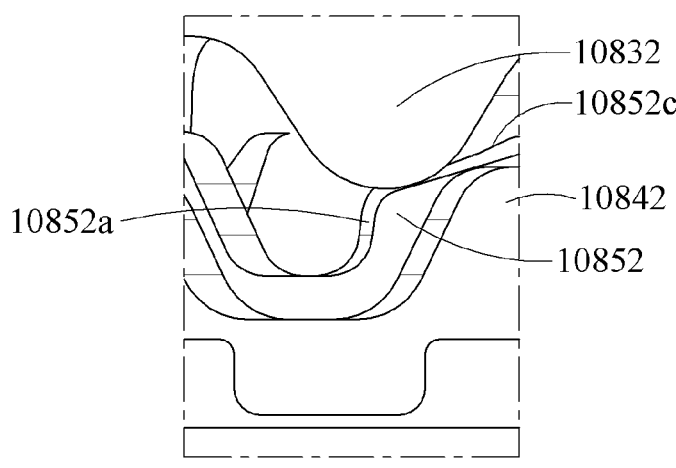
FIG. 10C is an enlarged view of a portion 10C of the hinge assembly of FIG. 10B.
Figure 10D:
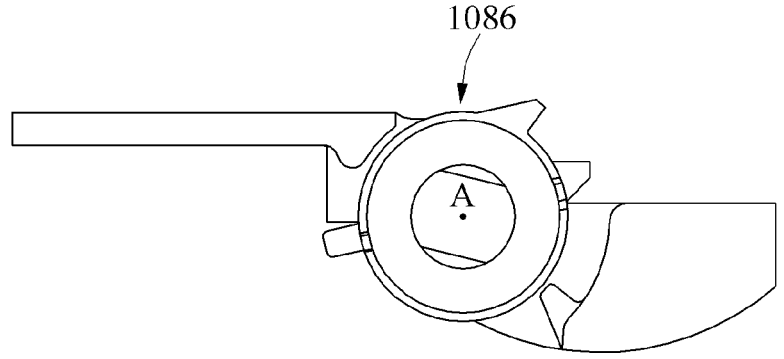
FIG. 10D is a view illustrating an interaction between an elastic body and a support ring when the electronic device of FIG. 10A is in the state immediately before the fully unfolded state.
Figure 10E:
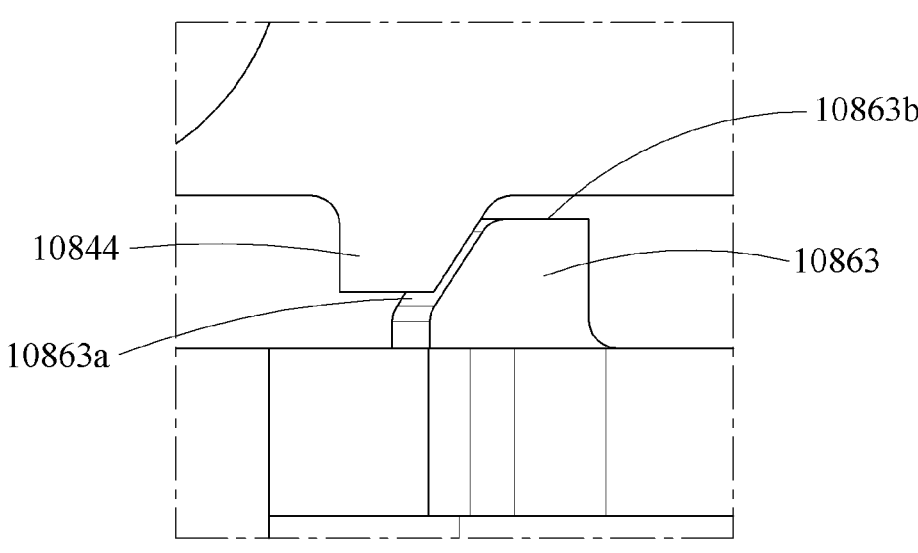
FIG. 10E is a view illustrating an interaction between a second cam and the support ring when the elastic body and the support ring of FIG. 10D interact with each other.
Figure 10F:
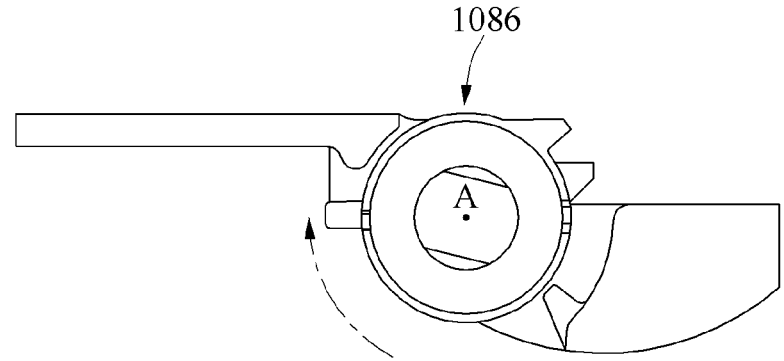
FIG. 10F is a view illustrating the elastic body and the support ring after the interaction between the elastic body and the support ring of FIG. 10D.
Figure 10G:
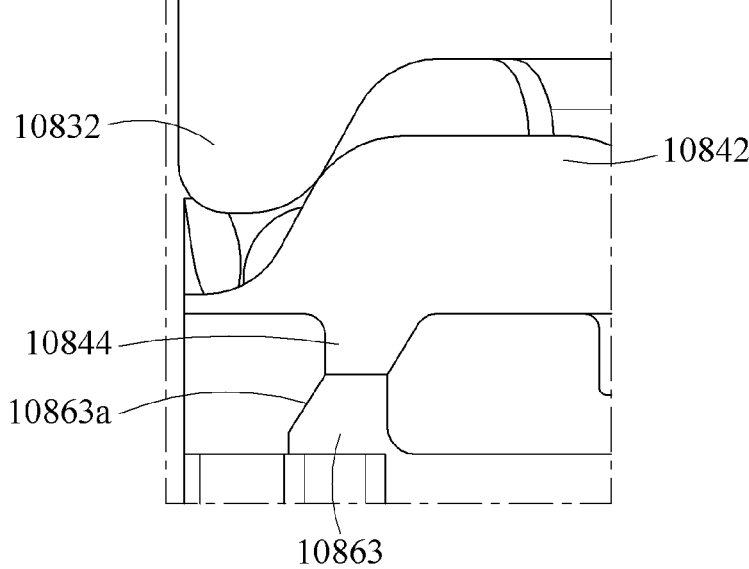
FIG. 10G is a view illustrating a first cam, the second cam, and the support ring after the interaction between the elastic body and the support ring of FIG. 10D.

Referring to FIGS. 9A to 9C, an electronic device 901 operating in an intermediate unfolded state in which a first housing 910 (e.g., the first housing 810) and a second housing 920 (e.g., the second housing 820) form a predetermined angle (e.g., about 70 degrees), after operating from a fully folded state (e.g., the state of the electronic device 801 of FIG. 8A), is shown.

Figure 8A:
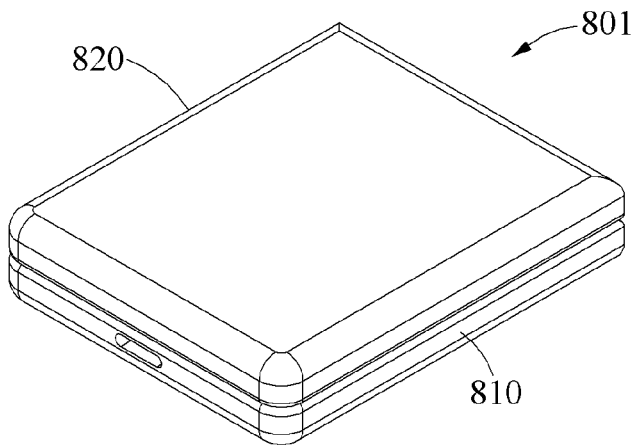
FIG. 8A is a view illustrating a fully folded state or a state immediately before the fully folded state of an electronic device according to an example embodiment.
Figure 8B:
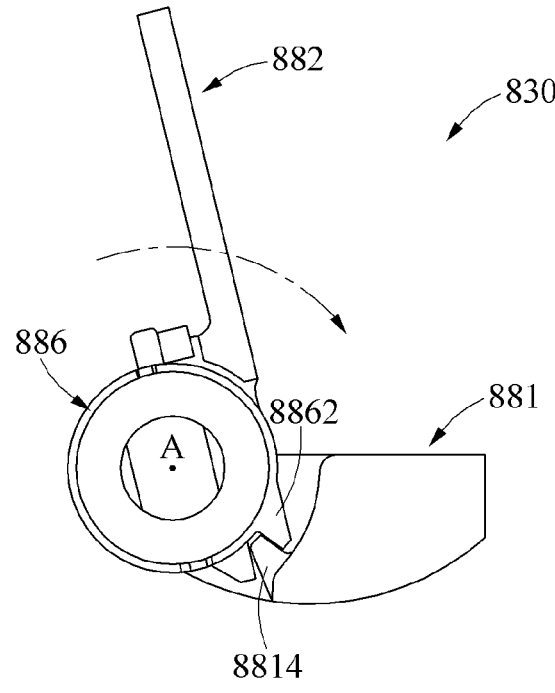
FIG. 8B is a view illustrating an interaction between a support ring and a fixing body when the electronic device of FIG. 8A is in the state immediately before the fully folded state.
Figure 8C:
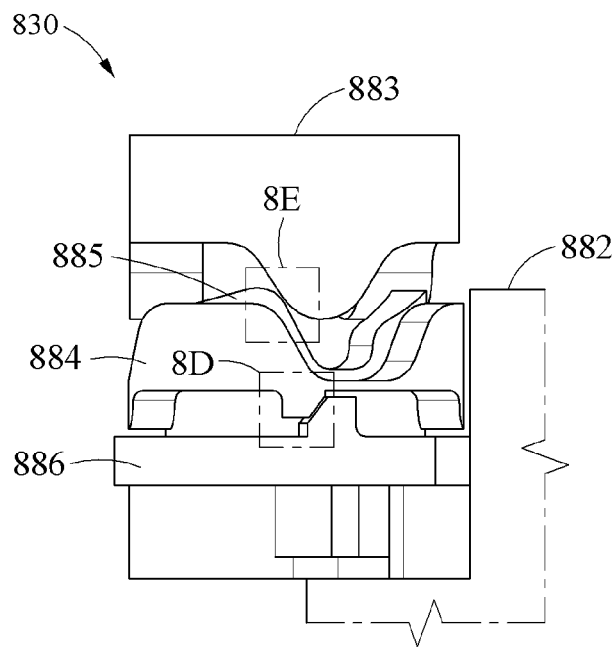
FIG. 8C is a view illustrating an interaction between a second cam and the support ring when the electronic device of FIG. 8A is in the state immediately before the fully folded state.
Figure 8D:
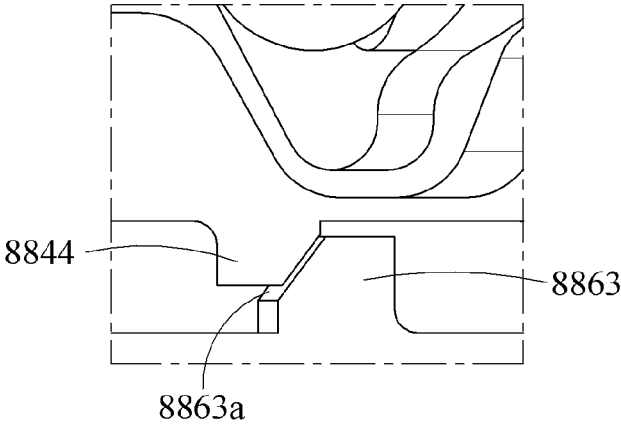
FIG. 8D is a view illustrating a portion of a hinge assembly when the electronic device of FIG. 8A is in the fully folded state.
Figure 8E:
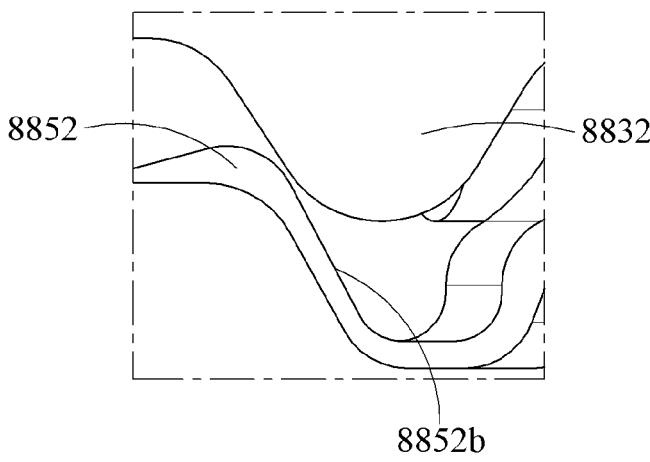
FIG. 8E is an enlarged view of a portion 8E of the hinge assembly of FIG. 8D illustrating an interaction between a first cam and the second cam when the electronic device of FIG. 8A is in the fully folded state.

In a hinge assembly 930 (e.g., the hinge assembly 830), a protruding portion 9844 (e.g., the protruding portion 8844) of a second cam 984 (e.g., the second cam 884) may still not be supported by a support protrusion 9863 (e.g., the support protrusion 8863) of a support ring 986 (e.g., the support ring 886) and maintain a state of contact on one surface (e.g., a top surface) on the circumference of the support ring 986 or an inclined surface 9863*a* (e.g., the inclined surface 8863*a*) of the support protrusion 9863, as in the state shown in FIG. 8C.

A first cam surface 9832 (e.g., the first cam surface 8832) of a first cam 983 (e.g., the first cam 883) may move from a fourth variable portion 9852*b* (e.g., the fourth variable portion 8852*b*) of a third cam surface 9852 (e.g., the third cam surface 8852) of a third cam 985 (e.g., the third cam 885) to a fifth variable portion 9852*c* (e.g., the fifth variable portion 4852*c*), and move along the fifth variable portion 9852*c*. At this time, the fifth variable portion 9852*c* may be formed with an inclined surface in the direction in which the electronic device 901 is unfolded. Thus, the first cam 983 may receive a moment along the fifth variable portion 9852*c* due to a torsional force of a second elastic body (e.g., the second elastic body 490). Accordingly, a large force from a user may not be required to unfold the electronic device 901.

Referring to FIGS. 10A to 10G, an electronic device 1001 operating in a state immediately before a fully unfolded state or the fully unfolded state in which a first housing 1010 (e.g., the first housing 910) and a second housing 1020 (e.g., the second housing 920) substantially form about 180 degrees, after operating from an intermediate unfolded state (e.g., the state of the electronic device 901 of FIG. 9A), is shown.

In a hinge assembly 1030 (e.g., the hinge assembly 930) during the state immediately before the fully unfolded state of the electronic device 1001, when a first cam 1083 (e.g., the first cam 983) is in contact with a third cam 1085 (e.g., the third cam 985), a first cam surface 10832 (e.g., the first cam surface 9832) of the first cam 1083 may be in a state of moving to an end position of a fifth variable portion 10852*c* (e.g., the fifth variable portion 9852*c*) of a third cam surface 10852 (e.g., the third cam surface 9852) (e.g., a position, on the fifth variable portion 10852*c*, adjacent to a third variable portion 10852*a*). An extra space where the first cam 1083 may perform a translational motion in one direction (e.g., upward) may be generated between the first cam 1083 and a second cam 1084 (e.g., the second cam 984), whereby the first cam surface 10832 may release the contact with the third cam surface 10852 by means of a restoring force of a support ring 1086, and move to a second cam surface 10842 (e.g., the second cam surface 4842) and contact the second cam surface 10842.

At this time, when an elastic restoring moment of a second elastic body (e.g., the second elastic body 490) is applied to the support ring 1086 (e.g., the support ring 486), the support ring 1086 may start to return to its original state (e.g., the state of FIG. 5E) by rotating about the folding axis A, the second cam 1084 may perform a translational motion by the elastic restoring moment of the second elastic body and an inclined surface 10863*a* (e.g., the inclined surface 4863*a*) of a support protrusion 10863 (e.g., the support protrusion 4863) of the support ring 1086, and a protruding portion 10844 (e.g., the protruding portion 4844) of the second cam 1084 may contact a horizontal surface 10863*b* (e.g., the horizontal surface 4863*b*) of the support protrusion 10863 and be supported by the horizontal surface 10863*b*, whereby the support ring 1086 may suppress the translational motion of the second cam 1084. In this process, as the second cam surface 10842 of the second cam 1084 meets the first cam surface 10832 of the first cam 1083, the translational motion of the second cam 1084 may be stopped, and the protruding portion 10844 of the second cam 1084 may be secured on the horizontal surface 10863*b* of the support protrusion 10863.

Thereafter, when the electronic device 1001 enters the fully unfolded state, in the hinge assembly 1030, the second cam 1084 may maintain a state of being supported by the support ring 1086, and the contact between the first cam surface 10832 of the first cam 1083 and the second cam surface 10842 of the second cam 1084 may be maintained.

Figure 11:
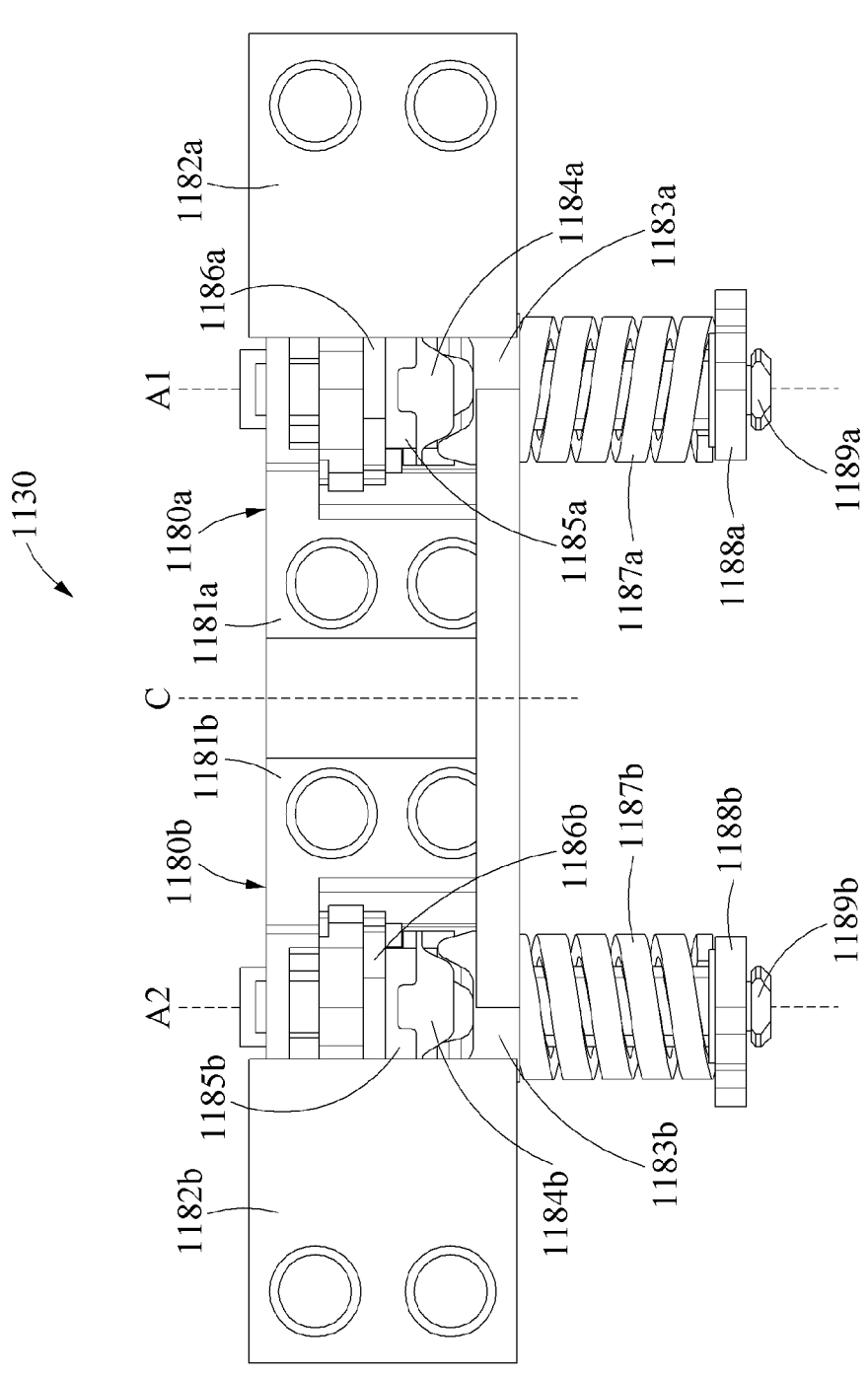
FIG. 11 is a view illustrating a hinge assembly according to an example embodiment.

Referring to FIG. 11, a hinge assembly 1130 may include a first hinge 1180*a* having a first folding axis A1 and a second hinge 1180*b* having a second folding axis A2. Here, the first hinge 1180*a* and the second hinge 1180*b* may include fixing bodies 1181*a* and 1181*b* (e.g., the fixing body 481), rotating bodies 1182*a* and 1182*b* (e.g., the rotating body 482), first cams 1183*a* and 1183*b* (e.g., the first cam 483), second cams 1184*a* and 1184*b* (e.g., the second cam 484), third cams 1185*a* and 1185*b* (e.g., the third cam 485), support rings 1186*a* and 1186*b* (e.g., the support ring 486), first elastic bodies 1187*a* and 1187*b* (e.g., the first elastic body 487), support bodies 1188*a* and 1188*b* (e.g., the support body 488), shafts 1189*a* and 1189*b* (e.g., the shaft 489), and second elastic bodies (e.g., the second elastic body 490), respectively, as described above with reference to FIGS. 4A to 4G. The first fixing body 1181*a* of the first hinge 1180*a* and the first fixing body 1181*b* of the second hinge 1180*b* may be fixed to at least a portion of a hinge cover (e.g., the hinge cover 365), and the first rotating body 1182*a* of the first hinge 1180*a* may rotate about the first folding axis A1 and support a first area (e.g., the first area 361*a*) of a display (e.g., the display 361), while the second rotating body 1182*b* of the second hinge 1180*b* may rotate about the second folding axis A2 and support a second area (e.g., the second area 361*b*) of the display. In certain example embodiments, the components of the first hinge 1180*a* and the components of the second hinge 1180*b* may be arranged symmetrically with respect to an imaginary centerline C of the hinge cover (e.g., the hinge cover 365).

According to various example embodiments, a foldable electronic device 201, 301 may include: a display 261, 361 including a first area 261*a*, 361*a*, a second area 261*b*, 361*b*, and a flexible area 261*c*, 361*c* between the first area 261*a*, 361*a* and the second area 261*b*, 361*b*, a first housing 210, 310 located around the first area 261*a*, 361*a*, a second housing 220, 320 located around the second area 261*b*, 361*b*, and a hinge assembly 330, 430, 1130 connected between the first housing 210, 310 and the second housing 220, 320 adjacent to at least a portion of the flexible area 261*c*, 361*c* to and operate between a folded position at which the first area 261*a*, 361*a* and the second area 261*b*, 361*b* face each other and an unfolded position at which the first area 261*a*, 361*a* and the second area 261*b*, 361*b* do not face each other, wherein the hinge assembly 330, 430, 1130 may include: a hinge cover 265, 365, a first hinge 1180*a* connected to the hinge cover 265, 365 to support the first area 261*a*, 361*a*, and a second hinge 1180*b* connected to the hinge cover 265, 365 to support the second area 261*b*, 361*b*, wherein each of the first hinge 1180*a* and the second hinge 1180*b* may include: a shaft 489, 1189*a*, 1189*b* with a folding axis A, a first cam 483, 1183*a*, 1183*b* configured to perform a linear motion along the folding axis A, a second cam 484, 1184*a*, 1184*b* configured to contact the first cam 483, 1183*a*, 1183*b*, and a third cam 485, 1185*a*, 1185*b* configured to contact the first cam 483, 1183*a*, 1183*b*, wherein the first cam 483, 1183*a*, 1183*b* may be configured to contact only one of the second cam 484, 1184*a*, 1184*b* and the third cam 485, 1185*a*, 1185*b*.

In certain example embodiments, the first cam 483, 1183*a*, 1183*b* may maintain contact with the second cam 484, 1184*a*, 1184*b* while the hinge assembly 330, 430, 1130 changes from the unfolded position to the folded position, and, when the hinge assembly 330, 430, 1130 enters the folded position, release the contact with the second cam 484, 1184*a*, 1184*b* and contact the third cam 485, 1185*a*, 1185*b*.

In certain example embodiments, the first cam 483, 1183*a*, 1183*b* may include a first cam body 4831 and a first cam surface 4832 formed on the first cam body 4831, and the second cam 484, 1184*a*, 1184*b* may include a second cam body 4841 and a second cam surface 4842 configured to contact the first cam surface 4832, wherein the second cam surface 4842 may be configured to apply an open maintain torque T1 to the first cam surface 4832 to maintain the hinge assembly 330, 430, 1130 at the unfolded position when the hinge assembly 330, 430, 1130 starts to change from the unfolded position to the folded position.

In certain example embodiments, the second cam 484 may include a second cam body 4841 and a second cam surface 4842 formed on the second cam body 4841, wherein the second cam surface 4842 may include: a first variable portion 4842*a*, a second variable portion 4842*b*, and an intermediate variable portion 4842*c* between the first variable portion 4842*a* and the second variable portion 4842*b*, wherein the first cam 483, 1183*a*, 1183*b* may be configured to stop at a predetermined position of the intermediate variable portion 4842*c* while the hinge assembly 330, 430, 1130 changes from the unfolded position to the folded position.

In certain example embodiments, the second cam 4842 may include a second cam body 4841 and a protruding portion 4844 formed on the second cam body 4841, wherein each of the first hinge 1180*a* and the second hinge 1180*b* may further include a support ring 486 including a ring body 4861 configured to rotate about the shaft 489, 1189a, 1189b and a support protrusion 4863 formed on the ring body 4861 and configured to support the second cam 484, wherein the support protrusion 4863 may be configured to support the protruding portion 4844 while the hinge assembly 330, 430, 1130 changes from the unfolded position to the folded position.

In certain example embodiments, the support protrusion 4863 may be configured not to support the protruding portion 4844 when the hinge assembly 330, 430, 1130 enters the folded position.

In certain example embodiments, each of the first hinge 1180a and the second hinge 1180b may further include: a fixing body 481 including a fixing plate 4812 configured to fix the shaft 489, 1189a, 1189b to the hinge cover 365 and a stopper 4814 connected to the fixing plate 4812, a rotating body 482 connected to the shaft 489, 1189a, 1189b to support the display 261, and a support ring 486 including a ring body 4861 configured to rotate about the shaft 489, 1189a, 1189b and a stopping protrusion 4862 formed on the ring body 4861 and configured to meet the stopper 4814, wherein the ring body 4861 may be configured to rotate in a direction opposite to a rotation direction of the rotating body 482 when the stopping protrusion 4862 meets the stopper 4814.

In certain example embodiments, the first cam 483, 1183a, 1183b may be configured to maintain contact with the third cam 485, 1185a, 1185b while the hinge assembly 330, 430, 1130 changes from the folded position to the unfolded position, and release the contact with the third cam 485, 1185a, 1185b and contact the second cam 484, 1184a, 1184b when the hinge assembly 330, 430, 1130 enters the unfolded position.

In certain example embodiments, the first cam 483, 1183a, 1183b may include a first cam body 4831 and a first cam surface 4832 formed on the first cam body 4831, and the third cam 485, 1185a, 1185b may include a third cam body 4851 and a third cam surface 4852 formed on the third cam body 4851, wherein the third cam surface 4852 may include: a third variable portion 4852a, a fourth variable portion 4852b, and a fifth variable portion 4852c between the third variable portion 4852a and the fourth variable portion 4852b, wherein the first cam surface 4832 may move, contacting the fifth variable portion 4852c, along the fifth variable portion 4852c from the third variable portion 4852a toward the fourth variable portion 4852b while the hinge assembly 330, 430, 1130 changes from the folded position to the unfolded position.

In certain example embodiments, the second cam 484, 1184a, 1184b may include a second cam body 4841 and a protruding portion 4844 formed on the second cam body 4841, wherein each of the first hinge 1180a and the second hinge 1180b may further include a support ring 486 including a ring body 4861 configured to rotate about the shaft 489, 1189a, 1189b and a support protrusion 4863 formed on the ring body 4861 and configured to support the second cam 484, 1184a, 1184b, wherein the support protrusion 4863 may be configured to support the protruding portion 4844 while the hinge assembly 330, 430, 1130 at the folded position or changes from the folded position to the unfolded position.

In certain example embodiments, each of the first hinge 1180a and the second hinge 1180b may further include a support ring 486 configured to support the second cam 484, 1184a, 1184b, wherein the support ring 486 may be configured to guide the second cam 484, 1184a, 1184b so that the second cam 484, 1184a, 1184b may meet the first cam 483, 1183a, 1183b when the hinge assembly 330, 430, 1130 enters the unfolded position.

According to various example embodiments, a hinge assembly 330, 430 may include: a hinge cover 365 and a hinge 480 connected to the hinge cover 365, wherein the hinge 480 may include: a shaft 489 with a folding axis A, a first cam 483 configured to perform a linear motion along the folding axis A, a second cam 484 configured to contact the first cam 483, and a third cam 485 configured to contact the first cam 483, wherein the first cam 483 may be configured to contact only one of the second cam 484 and the third cam 485.

In certain example embodiments, the second cam 484 may include a second cam body 4841 and a second cam surface 4842 formed on the second cam body 4841, wherein the second cam surface 4842 may include: a first variable portion 4842a, a second variable portion 4842b, and an intermediate variable portion 4842c between the first variable portion 4842a and the second variable portion 4842b.

In certain example embodiments, the third cam 485 may include a third cam body 4851 and a third cam surface 4852 formed on the third cam body 4851, wherein the third cam surface 4852 may include: a third variable portion 4852a, a fourth variable portion 4852b, and a fifth variable portion 4852c between the third variable portion 4852a and the fourth variable portion 4852b.

In certain example embodiments, the hinge 480 may further include a support ring 486 including a ring body 4861 and a support protrusion 4863 formed on the ring body 4861 and configured to support the second cam 484.

In certain example embodiments, the support protrusion 4863 may have an inclined surface 4863a configured to guide the protruding portion 4844 so that the second cam 484 may perform a translational motion along the folding axis A.

In certain example embodiments, the hinge 480 may further include: a fixing body 481 including a fixing plate 4812 configured to fix the shaft 489 to the hinge cover 365 and a stopper 4814 connected to the fixing plate 4812, and a support ring 486 including a ring body 4861 and a stopping protrusion 4862 formed on the ring body 4861 and configured to meet the stopper 4814.

In certain example embodiments, the second cam 484 and the third cam 485 may be disposed to surround the shaft 489, and a radial distance between the second cam 484 and the shaft 489 may be greater than a radial distance between the third cam 485 and the shaft 489.

In certain example embodiments, the hinge 480 may further include a fixing body 481 configured to fix the shaft 489 to the hinge cover 365.

In certain example embodiments, the hinge 480 may further include a rotating body 482 rotatably connected to the shaft 489.

Although the present disclosure has been described with various embodiments, various changes and modifications may be suggested to one skilled in the art. It is intended that the present disclosure encompass such changes and modifications as fall within the scope of the appended claims.

What is claimed is:
1. A foldable electronic device, comprising:
a display comprising a first area, a second area, and a flexible area between the first area and the second area;
a first housing located around the first area of the display;
a second housing located around the second area of the display; and a hinge assembly connected between the first housing and the second housing adjacent to at least a portion of the flexible area of the display and configured to operate between a folded position at which the first area and the second area face each other and an unfolded position at which the first area and the second area do not face each other, wherein the hinge assembly comprises:

a hinge cover connected to the first housing and the second housing;

an elastic body;

a first hinge connected to the hinge cover to support the first area of the display; and a second hinge connected to the hinge cover to support the second area of the display, wherein each of the first hinge and the second hinge comprises:

a shaft with a folding axis;

a first cam configured to perform a linear motion along the folding axis;

a second cam configured to contact the first cam; and a third cam configured to contact the first cam, and wherein the first cam is configured to contact only one of the second cam and the third cam at a time, and wherein the elastic body exerts a force on the first cam in a direction parallel to the folding axis.

2. The foldable electronic device of claim 1, wherein the first cam is configured to maintain contact with the second cam while the hinge assembly changes from the unfolded position to the folded position, and when the hinge assembly enters the folded position, release the contact with the second cam and contact the third cam.

3. The foldable electronic device of claim 1, wherein:

the first cam comprises a first cam body and a first cam surface formed on the first cam body, the second cam comprises a second cam body and a second cam surface configured to contact the first cam surface, and the second cam surface is configured to apply a maintain open torque to the first cam surface to maintain the hinge assembly at the unfolded position when the hinge assembly starts to change from the unfolded position to the folded position.

4. The foldable electronic device of claim 1, wherein:

the second cam comprises a second cam body and a second cam surface formed on the second cam body, the second cam surface comprises:

a first variable portion;

a second variable portion; and an intermediate variable portion between the first variable portion and the second variable portion, and the first cam is configured to stop at a predetermined position of the intermediate variable portion while the hinge assembly changes from the unfolded position to the folded position.

5. The foldable electronic device of claim 1, wherein:

the second cam comprises a second cam body and a protruding portion formed on the second cam body, each of the first hinge and the second hinge further comprises:

a support ring comprising a ring body configured to rotate about the shaft, and a support protrusion formed on the ring body and configured to support the second cam, and the support protrusion is configured to support the protruding portion while the hinge assembly changes from the unfolded position to the folded position.

6. The foldable electronic device of claim 5, wherein the support protrusion is configured not to support the protruding portion when the hinge assembly enters the folded position.

7. The foldable electronic device of claim 1, wherein:

each of the first hinge and the second hinge further comprises:

a fixing body comprising a fixing plate configured to fix the shaft to the hinge cover and a stopper connected to the fixing plate;

a rotating body connected to the shaft to support the display; and a support ring comprising:

a ring body configured to rotate about the shaft, and a stopping protrusion formed on the ring body and configured to meet the stopper, and the ring body is configured to rotate in a direction opposite to a rotation direction of the rotating body when the stopping protrusion meets the stopper.

8. The foldable electronic device of claim 1, wherein the first cam is configured to:

maintain contact with the third cam while the hinge assembly changes from the folded position to the unfolded position, and release the contact with the third cam and contact the second cam when the hinge assembly enters the unfolded position.

9. The foldable electronic device of claim 1, wherein:

the first cam comprises a first cam body and a first cam surface formed on the first cam body, and the third cam comprises a third cam body and a third cam surface formed on the third cam body, the third cam surface comprises:

a third variable portion;

a fourth variable portion; and a fifth variable portion between the third variable portion and the fourth variable portion, and the first cam surface is configured to move, contacting the fifth variable portion, along the fifth variable portion from the third variable portion toward the fourth variable portion while the hinge assembly changes from the folded position to the unfolded position.

10. The foldable electronic device of claim 1, wherein:

the second cam comprises a second cam body and a protruding portion formed on the second cam body, each of the first hinge and the second hinge further comprises:

a support ring comprising a ring body configured to rotate about the shaft, and a support protrusion formed on the ring body and configured to support the second cam, and the support protrusion is configured not to support the protruding portion while the hinge assembly is at the folded position or changes from the folded position to the unfolded position.

11. The foldable electronic device of claim 1, wherein:

each of the first hinge and the second hinge further comprises a support ring configured to support the second cam, and the support ring is configured to guide the second cam so that the second cam meets the first cam when the hinge assembly enters the unfolded position.

12. A hinge assembly, comprising:

a hinge, wherein the hinge comprises:

a shaft with a folding axis;

a first cam configured to perform a linear motion along the folding axis;

an elastic body configured to exert a force upon the first cam in a direction parallel to the folding axis;

a second cam configured to contact the first cam; and a third cam positioned inside the second cam and configured to contact the first cam, wherein the first cam is configured to contact only one of the second cam and the third cam at a time, and wherein a radial distance between the second cam and the shaft is greater than a radial distance between the third cam and the shaft.

13. The hinge assembly of claim 12, wherein:

the second cam comprises a second cam body and a second cam surface formed on the second cam body, and the second cam surface comprises:

a first variable portion;

a second variable portion; and an intermediate variable portion between the first variable portion and the second variable portion.

14. The hinge assembly of claim 12, wherein:

the third cam comprises a third cam body and a third cam surface formed on the third cam body, and the third cam surface comprises:

a third variable portion;

a fourth variable portion; and a fifth variable portion between the third variable portion and the fourth variable portion.

15. The hinge assembly of claim 12, wherein the hinge further comprises a support ring comprising a ring body and a support protrusion formed on the ring body and configured to support the second cam.

16. The hinge assembly of claim 15, wherein the support protrusion has an inclined surface configured to guide a protruding portion so that the second cam performs a translational motion along the folding axis.

17. The hinge assembly of claim 12, further comprising a hinge cover connected to the hinge, wherein the hinge further comprises:

a fixing body comprising a fixing plate configured to fix the shaft to the hinge cover and a stopper connected to the fixing plate; and a support ring comprising a ring body and a stopping protrusion formed on the ring body and configured to meet the stopper.

18. The hinge assembly of claim 12, wherein:

the second cam and the third cam are disposed to surround the shaft.

19. The hinge assembly of claim 12, further comprising a hinge cover connected to the hinge, wherein the hinge further comprises a fixing body configured to fix the shaft to the hinge cover.

20. The hinge assembly of claim 12, wherein the hinge further comprises a rotating body rotatably connected to the shaft.

* * * * *